US009133566B2

(12) United States Patent
Twitchen et al.

(10) Patent No.: US 9,133,566 B2
(45) Date of Patent: Sep. 15, 2015

(54) HIGH CRYSTALLINE QUALITY SYNTHETIC DIAMOND

(75) Inventors: Daniel James Twitchen, Sunningdale (GB); Grant Charles Summerton, Norwood (ZA); Ian Friel, Guildford (GB); John Olaf Hansen, Johannesburg (ZA); Keith Barry Guy, Marlow Bottom (GB); Michael Peter Gaukroger, Basingstoke (GB); Philip Maurice Martineau, Littlewick Green (GB); Robert Charles Burns, Johannesburg (ZA); Simon Craig Lawson, Maidenhead (GB); Timothy Patrick Gerard Addison, Midrand (ZA)

(73) Assignee: ELEMENT SIX TECHNOLOGIES LIMITED, London (GB)

( * ) Notice: Subject to any disclaimer, the term of this patent is extended or adjusted under 35 U.S.C. 154(b) by 1194 days.

(21) Appl. No.: 12/094,857
(22) PCT Filed: Dec. 8, 2006
(86) PCT No.: PCT/IB2006/003531
§ 371 (c)(1),
(2), (4) Date: Jan. 8, 2009
(87) PCT Pub. No.: WO2007/066215
PCT Pub. Date: Jun. 14, 2007

(65) Prior Publication Data
US 2009/0127506 A1 May 21, 2009

Related U.S. Application Data

(60) Provisional application No. 60/760,376, filed on Jan. 20, 2006.

(30) Foreign Application Priority Data

Dec. 9, 2005 (ZA) .................................. 2005/10024

(51) Int. Cl.
C30B 29/02 (2006.01)
C30B 29/04 (2006.01)
(Continued)

(52) U.S. Cl.
CPC ............... *C30B 29/04* (2013.01); *C30B 25/105* (2013.01); *C23C 16/27* (2013.01); *C30B 25/00* (2013.01); *C30B 29/02* (2013.01)

(58) Field of Classification Search
None
See application file for complete search history.

(56) References Cited

U.S. PATENT DOCUMENTS 4,034,066 A 7/1977 Strong et al.
4,836,881 A 6/1989 Satoh et al.
(Continued)

FOREIGN PATENT DOCUMENTS

EP 0 715 885 A2 6/1996
JP 2003-303954 10/2003
(Continued)

OTHER PUBLICATIONS

V.D. Antsygin, et al. "Some Aspects of Transformation of Synthetic Diamond Defects Under the Action of High Temperatures and Pressures", Optoelectronics, Instrumentation and Data Processing, Issue 1 (1998), pp. 9-15.

(Continued)

*Primary Examiner* — Guinever S Gregorio
(74) *Attorney, Agent, or Firm* — Dean W. Russell; Kilpatrick Townsend & Stockton LLP

(57) ABSTRACT

The invention relates to a single crystal CVD diamond material, wherein the extended defect density as characterized by X-ray topography is less than 400/cm2 over an area of greater than 0.014 cm2. The invention further relates to a method for producing a CVD single crystal diamond material according to any preceding claim comprising the step of selecting a substrate on which to grow the CVD single crystal diamond, wherein the substrate has at least one of a density of extended defects as characterized by X-ray topography of less than 400/cm2 over an area greater than 0.014 cm2; an optical isotropy of less than 1×10-5 over a volume greater than 0.1 mm3; and a FWHM X-ray rocking curve width for the (004) reflection of less than 20 arc seconds.

24 Claims, 19 Drawing Sheets

(51) Int. Cl.
*C30B 25/10* (2006.01)
*C30B 25/00* (2006.01)
*C23C 16/27* (2006.01)

(56) References Cited

U.S. PATENT DOCUMENTS 5,908,503 A * 6/1999 Sumiya et al. ............ 117/79
6,858,080 B2 * 2/2005 Linares et al. ............ 117/86

FOREIGN PATENT DOCUMENTS

| | | |
|---|---|---|
| JP | 2005/512928 | 5/2005 |
| JP | 2009-165295 | 7/2009 |
| WO | WO 01/96633 A1 | 12/2001 |
| WO | WO 01/96634 A1 | 12/2001 |
| WO | WO 03/052174 A2 | 6/2003 |
| WO | WO 03/052177 A1 | 6/2003 |
| WO | 2004/027123 | 4/2004 |
| WO | WO 2004/027123 A1 | 4/2004 |
| WO | 2005/053029 | 6/2005 |
| WO | WO 2006/061707 A2 | 6/2006 |
| ZA | 20040009975 | 12/2004 |
| ZA | 20050004019 | 5/2005 |

OTHER PUBLICATIONS

A.R. Lang, et al. "Diffraction and Imaging Studies of Diamond", pp. 215-258.

A.M. Glazer, et al. "An automatic optical imaging system for birefringent media", Proc. Roy. Soc. Lond. A vol. 452 (1996), pp. 2751-2765.

G. Grubel, et al., "A diamond double-crystal transmission monochromator for the TROIKA II station at ESRF", Rev. Sci Instrum. vol. 67, No. 9, Sep. 1996, p. 3349.

Diffraction by perfect crystals, (29 pages).

M.A. Plano, et al., "Characterization of a Thick Homoepitaxial CVD Diamond Film", Mat. Res. Soc. Symp. Proc. vol. 339, (1994), pp. 307-312—XP001017914.

T. Bauer, et al, "Structural defects in homoepitaxial diamond layers grown on off-axis Ib HPHT substrates", Phys. Stat. Solid A, vol. 203, No. 12 (2006), pp. 3056-3062-XP-002445508.

Office Action as received in the corresponding Japanese Patent Application No. 2008-543937 dated May 15, 2012 (English Translation Only).

Combined Taiwanese Office Action and Search Report Issued Apr. 3, 2013 in Patent Application No. 095146264 (with English translation of Categories of Cited Documents).

* cited by examiner

HIGH CRYSTALLINE QUALITY SYNTHETIC DIAMOND

CROSS-REFERENCE TO RELATED APPLICATIONS

This application is a 371 of PCT/IB06/03531 filed Dec. 8, 2006 and claims the benefit of U.S. 60/760,376 filed Jan. 20, 2006 and South African application 2005 10024 filed Dec. 9, 2005.

INTRODUCTION

This invention relates to high crystalline quality synthetic diamond. In particular, this invention relates to synthetic diamond material exhibiting here-to-before unknown low levels of extended defect density with a specific controlled point defect density.

The crystalline perfection of the diamond according to the present invention is controlled by a series of synthesis, analysis and processing steps. In the present context, the term 'crystalline quality' relates to the concentration of extended defects such as dislocations and stacking faults, such that high crystalline quality material contains a low concentration of extended defects. The present invention provides diamond in which the extended defect density is controlled and minimized using a process which is compatible with intentionally doping the material with point defects that might have other benefits in specific applications.

BACKGROUND TO THE INVENTION

The synthesis of diamond by various methods is well known and well established. One such example is the synthesis of diamond under high temperature and high pressure (HPHT). There are two principal methods employed for HPHT synthesis of diamond and both are from solution. The one method is a temperature gradient method and the other is an allotropic change method. In the temperature gradient method, the driving force for crystal growth is the supersaturation due to the difference in solubilities of the carbon source material and the growing crystal as a result of a temperature difference between the two. The carbon that is present in the higher temperature region migrates to the seed crystal, which is positioned in the lower temperature region, via a solvent/catalyst material that separates the source material and seed crystal. Such a temperature gradient method is described generally in U.S. Pat. No. 4,034,066.

Almost all diamond synthesised from solution contains nitrogen and is diamond of type Ib. When growing type IIa diamond material which has a nitrogen content generally lower than 1 ppm (parts per million), removal of nitrogen from the starting materials is necessary. This is typically achieved by using a nitrogen getter. The nitrogen getter or agent is added to the solvent/catalyst, which is typically a molten alloy of the transition metals cobalt, iron and nickel. This agent has the effect of preferentially sequestering the nitrogen in the metallic melt, either as a solute or as a precipitated nitride or carbo-nitride. Such agents are typically elements like titanium, zirconium and aluminium.

The applicant's pending South African patent application Nos. 2004/9975 and 2005/04019 teach that type IIa diamond substrates can be grown in which the crystalline perfection in the {100}, {113} and {115} growth sectors approaches that of a perfect extended diamond cubic lattice and where the extended defect density is minimized. Such material has many potential applications, including use as a substrate in a subsequent chemical vapour deposition (CVD) growth process.

However, there remain four key limitations with the diamond synthesis techniques as taught in the above pending applications:

a) Cost. Using getters to control the incorporation of nitrogen is well known to reduce the growth rate of HPHT material. Although this invention still requires the growth of HPHT IIa material, using this as substrate material in a chemical vapour deposition (CVD) diamond synthesis process means that one plate might be used several times over, i.e. following the CVD growth the substrate might be reclaimed and grown on again. In addition the CVD process might be compatible with higher linear growth rates as well as replicating additional diamond plates of high crystal perfection from the first HPHT plate.

b) Although the growth sectors of HPHT synthesis can be controlled by parameters such as temperature and pressure, there are always {111} growth sectors which have a higher concentration of extended defects.

c) It is very difficult to controllably dope HPHT material with dopants such as P, B, N, Li, Na, Al, Si, S, etc. which might be needed in some applications which, for example, use the electronic properties of diamond.

d) Producing multilayer samples, where within one diamond there might be two or more layers which differ in the point defect density, such that there is a sharp interface both in space and doping concentration, is very difficult using HPHT techniques.

In addition, using HPHT synthesis methods it is very hard to eliminate impurities such as boron to the extent required in some applications that require material with the intrinsic properties of undoped diamond. Although to some extent these disadvantages can be overcome, the parameter space for growing high crystalline quality diamond makes it very difficult to control all these issues within a single high pressure-high temperature growth run.

Annealing is a method well known in the field of materials science to improve the crystal domain size and perfection of the domains generally. Usually annealing is performed at an elevated temperature with or without an increased pressure depending largely on what part of the diamond-graphite phase space the annealing is performed in. For example, U.S. Pat. No. 5,908,503 discusses the use of a high temperature furnacing stage, typically using temperatures of 1100° C. to 1600° C. and low pressures, using a non-oxidising atmosphere to improve the crystalline perfection of diamond. The non-oxidising atmosphere is a requirement to prevent the oxidation and loss of the diamond crystal during treatment.

Annealing of extended lattice defects in diamond requires diffusion of carbon atoms. The diamond lattice is a very tightly bonded lattice and diffusion is restricted except under certain conditions. Increasing temperature increases diffusion, but increasing pressure generally reduces it. In type Ib diamond the presence of significant levels of nitrogen in the diamond significantly enhances diffusion. Although some prior art (V. D. Antsygin's article in Optoelectronics Instrumentation and Data Processing (1998) No. 1 p9) have shown an improvement on the crystalline perfection in BARS grown type Ib diamond on annealing at 2100° C., the extended defects and annealing mechanism in type Ib and IIa are quite different and the prior art teaches that it is very difficult to remove structural defects in diamond containing a low nitrogen concentration.

'BARS' is the acronym for a Russian-developed type of apparatus used for applying high pressures and high temperatures that is also referred to as the 'split-sphere' technique by those skilled in the art.

Methods of depositing or growing material such as diamond on a substrate by chemical vapour deposition (CVD) are now well established and have been described extensively in the patent and other literature. Where diamond is being deposited on a substrate, the method generally involves providing a gas mixture which, on dissociation, can provide hydrogen or a halogen (e.g. F, Cl) in atomic form and C or carbon-containing radicals and other reactive species, e.g. $CH_x$, $CF_x$ wherein x can be 1 to 4. In addition, oxygen containing sources may be present, as may sources for nitrogen and for boron. In many processes inert gases such as helium, neon or argon are also present. Thus, a typical source gas mixture will contain hydrocarbons $C_xH_y$ wherein x and y can each be 1 to 10 or halocarbons $C_xH_yHal_z$ wherein x and z can each be 1 to 10 and y can be 0 to 10 and optionally one or more of the following: $CO_x$, wherein x can be 0.5 to 2, $O_2$, $H_2$ and an inert gas. Each gas may be present in its natural isotopic ratio, or the relative isotopic ratios may be artificially controlled; for example hydrogen may be present as deuterium or tritium, and carbon may be present as $^{12}C$ or $^{13}C$. Dissociation of the source gas mixture is brought about by an energy source such as microwaves, RF (radio frequency) energy, a flame, a hot filament or jet based technique and the reactive gas species so produced are allowed to deposit onto a substrate and form diamond.

The prior art teaches that dislocations in CVD diamond arise from three sources: continuing from dislocations in the surface upon which CVD growth takes place, nucleation of new dislocations at the interface, and by dislocation multiplication during growth, particularly where the dislocation density is already high.

CVD diamond may be produced on a variety of substrates. Depending on the nature of the substrate and details of the process chemistry, polycrystalline or single crystal CVD diamond (the object of this invention) may be produced. A need exists for single crystal diamond material having exceptional crystalline quality and controlled point defect concentrations. A further need exists for a method for creating such diamond.

SUMMARY OF THE INVENTION

The present invention relates to a single crystal CVD diamond material wherein the extended defect density as characterised by X-ray topography is less than 400/cm² over an area greater than 0.014 cm².

As used herein, an "extended defect" means a "stacking fault" and/or a "dislocation", these terms being well known in the art. For example, stacking faults and dislocations in diamond are described in "The Properties of Natural and Synthetic Diamond", edited by J E Field, Academic Press 1992, pages 215-258.

A "stacking fault" is related to dislocations in that a stacking fault is bounded by one or more dislocations. Where the stacking fault does not intersect a surface, then its boundary is defined by a single dislocation loop. Where the stacking fault intersects a surface, this dislocation loop is broken. Where the stacking fault intersects two surfaces, it is bounded by two dislocations. Thus, when counting extended defects, stacking faults are counted by virtue of them contributing either one or two dislocations and a dislocation count is sufficient to count all extended defects. The predominate type of extended defect in CVD diamond is dislocations rather than stacking faults.

Preferably, the extended defect density as characterised by X-ray topography is less than 300/cm², preferably less than 200/cm², preferably less than 100/cm². Preferably, the extended defect density is characterised over an area of greater than 0.1 cm², preferably greater than 0.25 cm², preferably greater than 0.5 cm², preferably greater than 1 cm², preferably greater than 2 cm².

The CVD diamond material of the invention may further have an optical isotropy, $\Delta n$, of less than $1 \times 10^{-5}$, preferably less than $5 \times 10^{-6}$, preferably $2 \times 10^{-6}$, preferably less than $1 \times 10^{-6}$, over a volume greater than 0.1 mm³, preferably greater than 0.5 mm³, preferably greater than 1 mm³, preferably greater than 3.4 mm³, preferably greater than 8 mm³, preferably greater than 27 mm³, preferably greater than 64 mm³, preferably greater than 125 mm³, preferably greater than 512 mm³, preferably greater than 1000 mm³.

$\Delta n$ is the difference between the refractive indices $n_1$ and $n_2$. $\Delta n$ may also be referred to as the "birefringence". $\Delta n$ is the average value of birefringence over the thickness of the sample being measured, for example, calculated as described in WO 2004/046427. The value of $\Delta n$ may be determined from the optical retardation $\Delta nL$ (where L is the thickness of the sample in the direction in which $\Delta n$ is being measured). $\Delta nL$ may be measured by the technique techniques described in A. M. Glazer et al, Proc. R. Soc. Lond. A, 452 (1996), 2751-2765, using a birefringence imaging system, of which 'Metripol' manufactured by Oxford Cryosystems, Long Hanborough, Oxford, UK, is an example.

The method of the invention provides for fabrication of CVD diamond such that for a sample with first, second and third dimensions in three orthogonal directions, the first dimension is preferably greater than 0.2 mm, preferably greater than 0.5 mm, preferably greater than 1 mm, preferably greater than 2 mm, preferably greater than 4 mm. The second and third dimensions are greater than the first dimension and are preferably greater than 1 mm, preferably greater than 2 mm, preferably greater than 4 mm, preferably greater than 7 mm, preferably greater than 15 mm. The maximum birefringence, $\Delta n_{[maximum]}$, measured in the three orthogonal directions is less than $1 \times 10^{-5}$, preferably less than $5 \times 10^{-6}$, preferably less than $2 \times 10^{-6}$, preferably less than $1 \times 10^{-6}$, for at least one of the three orthogonal directions, preferably at least two of the three orthogonal directions, preferably all three of the three orthogonal directions.

Preferably, the full width at half maximum (FWHM) of the x-ray rocking curve of the CVD diamond material is less than 10 arc seconds. An arc second is $\frac{1}{60}^{th}$ of an arc minute and an arc minute is $\frac{1}{60}^{th}$ of an angular degree. Preferably, the FWHM is less that 7 arc seconds, preferably less than 5 arc seconds, preferably less than 3 arc seconds, preferably less than 2 arc seconds, preferably less than 1.5 arc seconds. Typically the FWHM of the rocking curve is measured for an appropriate {004}-type reflection by techniques well known in the art.

Preferably, the single crystal CVD diamond material has simultaneously controlled point defect density in addition to having the low extended defect density as described above.

As used herein, a "point defect" in diamond is an atom other than hydrogen or carbon on either a lattice site or a non-lattice site. Point defects that result from intentional additions of species to the growth environment may also be referred to as "dopants" or "dopant atoms". Point defects that result from unintentional additions of species to the growth environment may also be referred to as "impurities" or "impurity atoms". Point defects where the atom is on a lattice site may also be referred to as "substitutional defects" or "substitutional atoms" or "substitutional impurities". Point defects where the atom is on a non-lattice site may also be referred to as "interstitial defects" or "interstitial atoms" or "interstitial impurities".

Preferably, the CVD diamond of this invention is grown on other diamond material which has been selected against specific criteria using X-ray and/or birefringence techniques. By using material selected according to the extended defect density and/or birefringence criteria described above (and explained in more detail below) as a substrate, not only is it possible to prepare material with exceptional crystalline quality, but also material containing a controlled density of point defects. For instance, material characterised as having birefringence (or optical isotropy) and extended defect density as defined above might also contain point defects such as nitrogen, boron, lithium, phosphorous, silicon, sulphur etc which are compatible with the CVD growth process in the concentration range 0.1 ppb (parts per billion) to 10000 ppm (parts per million). In practice, for applications currently known to be of interest the nitrogen concentration will typically be controlled to be <10 ppm, more preferably <1 ppm and most preferably <0.01 ppm, and the atomic boron concentration might for some applications be less than 10 ppm, but in others to be >100 ppm, more preferably >500 ppm but most preferably >2000 ppm. To those skilled in the art it is obvious that these dopants and their concentrations might be controlled to within different limits depending on the nature of the application.

In a crystal as strongly bonded as diamond, stacking faults are very closely aligned with crystallographic planes and directions. Stacking faults in diamond typically lie on {111} planes and the edges of stacking faults are typically close to <110> directions. Thus in a substrate that is prepared with the surface to be used for CVD growth close to the (001) plane (that is, within approximately 5°), stacking faults may be present which have segments of edge that are approximately (that is, within approximately 5°) parallel to the surface.

Where stacking faults in the substrate used for subsequent CVD diamond growth have one or more segments that are substantially parallel to the surface of the substrate subsequently used for growth, there are three possible effects on the subsequently grown CVD layer.

A first possibility is that a stacking fault segment is sufficiently below the surface that it is not exposed by the pre-growth etching step; under such circumstances the CVD diamond growth will be substantially unaffected by its presence.

A second possibility is that a stacking fault segment intersects the surface of the substrate subsequently used for growth, either after polishing of the substrate surface or after being exposed by the pre-growth etch, and, during subsequent growth, grows as a stacking fault into the CVD diamond layer. This is an effect which has not been observed to date.

A third possibility is that a stacking fault segment intersects the surface of the substrate subsequently used for growth, either after polishing of the substrate surface or after being exposed by the pre-growth etch, and one or more dislocations are nucleated on or adjacent to the exposed edge of the stacking fault and propagate roughly in the growth direction as the CVD diamond layer grows.

The reason why the dislocations are nucleated rather than the stacking fault growing are unknown, but it may be necessitated by the need to maintain the continuity of the crystal structure.

In the event that a stacking fault segment is exposed by the pre-growth etch and one or more dislocations are nucleated, the number of dislocations that nucleate can be very high and thus this is a highly undesirable situation. Therefore preferably the substrate used to make the material of the present invention is selected carefully to ensure that the number of stacking faults that might be exposed during the pre-growth etch stage of the CVD growth process is minimised. In this regard, it is particularly preferred that there are no stacking faults present that might be exposed during the pre-growth etch stage of the CVD growth process.

The presence of stacking faults which might be exposed during the pre-growth etch stage of the CVD growth process may be conveniently expressed as a measure of the line length of stacking fault segment substantially parallel to the substrate surface used for growth (that is, within approximately 5°). Such measurements can be made from X-ray topographs, preferably using {111} reflections. Since it is not always clear from the X-ray topograph whether the stacking fault intersects the surface, this method of analysis includes all stacking fault segments which are aligned as above, projecting the position of the stacking fault edges onto the said surface used for growth.

Preferably the material used as the substrate for the growth of the material of the current invention has preferably less than about 1000 cm of stacking fault edge length substantially parallel to the substrate surface used for growth per cm$^2$ of this substrate surface as measured by X-ray topography, preferably less than about 500 cm of stacking fault edge length substantially parallel to the substrate surface used for growth per cm$^2$ of this substrate surface as measured by X-ray topography, preferably less than about 300 cm of stacking fault edge length substantially parallel to the substrate used for growth per cm$^2$ of this substrate surface as measured by X-ray topography, preferably less than about 200 cm of stacking fault edge length substantially parallel to the substrate surface used for growth per cm$^2$ of this substrate surface as measured by X-ray topography, preferably less than about 100 cm of stacking fault edge length substantially parallel to the substrate surface used for growth per cm$^2$ of this substrate surface as measured by X-ray topography, preferably less than about 50 cm of stacking fault edge length substantially parallel to the substrate surface used for growth per cm$^2$ of this substrate surface as measured by X-ray topography, preferably less than about 30 cm of stacking fault edge length substantially parallel to the substrate surface used for growth per cm$^2$ of this substrate surface as measured by X-ray topography, preferably less than about 20 cm of stacking fault edge length substantially parallel to the substrate surface used for growth per cm$^2$ of this substrate surface as measured by X-ray topography, preferably less than about 10 cm of stacking fault edge length substantially parallel to the substrate surface used for growth per cm$^2$ of this substrate surface as measured by X-ray topography, preferably less than about 5 cm of stacking fault edge length substantially parallel to the substrate surface used for growth per cm$^2$ of this substrate surface as measured by X-ray topography, preferably less than about 3 cm of stacking fault edge length substantially parallel to the substrate surface used for growth per cm$^2$ of this substrate surface as measured by X-ray topography, preferably less than about 2 cm of stacking fault edge length substantially parallel to the substrate surface used for growth per cm$^2$ of this substrate surface as measured by X-ray topography, preferably less than about 1 cm of stacking fault edge length substantially parallel to the substrate surface used for growth per cm$^2$ of this substrate surface as measured by X-ray topography, preferably less than about 0.5 cm of stacking fault edge length substantially parallel to the substrate surface used for growth per cm$^2$ of this substrate surface as measured by X-ray topography, preferably less than about 0.3 cm of stacking fault edge length substantially parallel to the substrate surface used for growth per cm$^2$ of this substrate surface as measured by X-ray topography, preferably less than about 0.2 cm of stacking fault edge length substantially parallel to the substrate surface used for growth per cm$^2$ of this substrate surface as measured by X-ray topography, preferably less than about 0.1 cm of stacking fault edge length substantially parallel to the substrate surface used for growth per cm$^2$ of this substrate surface as measured by X-ray topography, preferably less than 0.05 cm of stacking fault edge length substantially parallel to the substrate surface used for growth per cm$^2$ of this substrate surface as measured by X-ray topography, preferably less than 0.03 cm of stacking fault edge length substantially parallel to the substrate surface used for growth per cm$^2$ of this substrate surface as measured by X-ray topography, preferably less than about 0.02 cm of stacking fault edge length substantially parallel to the substrate surface used for growth per cm$^2$ of this substrate surface as measured by X-ray topography, preferably less than about 0.01 cm of stacking fault edge length substantially parallel to the substrate surface used for growth per cm$^2$ of this substrate surface as measured by X-ray topography, and most preferably 0 cm of stacking fault edge length substantially parallel to the substrate surface used for growth per cm$^2$ of this substrate surface as measured by X-ray topography.

Hydrogen is specifically excluded as being a point defect as defined herein in the CVD diamond of the invention.

The concentration of point defects as previously defined may be determined by techniques such as glow discharge mass spectroscopy ("GDMS") or secondary ion mass spectroscopy ("SIMS"), the use of which in relation to diamond, and in particular for the measurement of the concentration of impurities and dopants such as nitrogen and boron, has been disclosed in WO01/96634.

The CVD diamond of the invention preferably has a controlled total point defect density as defined above of less than 10000 ppm (parts per million), preferably less than 1000 ppm, preferably less than 100 ppm, preferably less than 30 ppm, preferably less than 10 ppm, preferably less than 3 ppm, preferably less than 1 ppm, preferably less than 0.3 ppm, preferably less than 0.1 ppm.

The CVD diamond of the invention may have a concentration of nitrogen in the solid that is controlled such that it is preferably less than 10 ppm, preferably less than 1 ppm, preferably less than 0.1 ppm, preferably less than 0.01 ppm, preferably less than 1 ppb, preferably less than 0.1 ppb.

The CVD diamond of the invention may have a concentration of boron in the solid that is controlled such that it is preferably less than 10 ppm, preferably less than 3 ppm, preferably less than 1 ppm, preferably less than 0.1 ppm, preferably less than 0.01 ppm, preferably less than 1 ppb, preferably less than 0.1 ppb.

Alternatively, in certain applications it may be desirable for the CVD diamond of the invention to have a concentration of boron that is controlled such that the concentration of boron in the solid is preferably greater than $1 \times 10^{18}$ atoms/cm$^3$, preferably greater than $5 \times 10^{18}$ atoms/cm$^3$, preferably greater than $1 \times 10^{19}$ atoms/cm$^3$, preferably greater than $3 \times 10^{19}$ atoms/cm$^3$, preferably greater than $1 \times 10^{20}$ atoms/cm$^3$, preferably greater than $3 \times 10^{20}$ atoms/cm$^3$.

The CVD diamond of the invention may have a concentration in the solid of phosphorus that is controlled such that it is preferably less than 100 ppm, preferably less than 10 ppm, preferably less than 1 ppm, preferably less than 0.1 ppm, preferably less than 0.01 ppm, preferably less than 1 ppb, preferably less than 0.1 ppb.

Alternatively, in certain applications it may be desirable for the CVD diamond of the invention to have a concentration in the solid of phosphorus that is controlled such that it is preferably greater than $1 \times 10^{18}$ atoms/cm$^3$, preferably greater than $5 \times 10^{18}$ atoms/cm$^3$, preferably greater than $1 \times 10^{19}$ atoms/cm$^3$, preferably greater than $3 \times 10^{19}$ atoms/cm$^3$, preferably greater than $1 \times 10^{20}$ atoms/cm$^3$.

The CVD diamond of the invention may have a concentration in the solid of sulphur that is controlled such that it is preferably less than 10 ppm, preferably less than 1 ppm, preferably less than 0.1 ppm, preferably less than 0.01 ppm, preferably less than 1 ppb, preferably less than 0.1 ppb.

Alternatively, in certain applications it may be desirable for the CVD diamond of the invention to have a concentration in the solid of sulphur that is controlled such that it is preferably greater than $1 \times 10^{18}$ atoms/cm$^3$, preferably greater than $5 \times 10^{18}$ atoms/cm$^3$, preferably greater than $1 \times 10^{19}$ atoms/cm$^3$, preferably greater than $3 \times 10^{19}$ atoms/cm$^3$, preferably greater than $1 \times 10^{20}$ atoms/cm$^3$.

The CVD diamond of the invention may have a concentration in the solid of silicon that is controlled such that it is preferably less than 10 ppm, preferably less than 1 ppm, preferably less than 0.1 ppm, preferably less than 0.01 ppm, preferably less than 1 ppb, preferably less than 0.1 ppb.

The CVD diamond of the invention may have a total concentration in the solid of nitrogen, boron, sulphur, phosphorus and silicon of preferably less than 10 ppm, preferably less than 5 ppm, preferably less than 2 ppm, preferably less than 1 ppm, preferably less than 0.5 ppm, preferably less than 0.2 ppm, preferably less than 0.1 ppm, preferably less than 0.05 ppm.

The CVD diamond of the invention may have a point defect density originating from impurities or dopants other than nitrogen, boron, silicon, sulphur, phosphorus and hydrogen of less than 10 ppm, preferably less than 5 ppm, preferably less than 2 ppm, preferably less than 1 ppm, preferably less than 0.5 ppm, preferably less than 0.2 ppm, preferably less than 0.1 ppm, preferably less than 0.05 ppm.

The uniformity of concentration of any point defect (that is, an atom that is neither carbon nor hydrogen) including nitrogen, boron, phosphorus, sulphur and silicon, when averaged over at least five measurements made at different locations on a surface which is within approximately 5° of being perpendicular to the growth direction is preferably such that any single value is preferably within ±75% of the average value, more preferably ±50% of the average value and most preferably within ±30% of the average value.

For some applications it may be advantageous to make layered structures which comprise CVD single crystal diamond material of the present invention. For example a layered structure comprising a plurality of boron doped and intrinsic (i.e. high purity) layers may form the basis of electronic devices ranging from Schottky diodes to MESFETs (MEtal Semiconductor Field Effect Transistors).

In this way the single crystal CVD diamond of the present invention offers solutions to all four issues associated with the HPHT process listed in the introduction. For example, single crystal CVD diamond can be doped with boron, by introducing a boron containing gas/compound into the CVD growth vessel. Until now the homoepitaxial nature of the process meant that, although the point defect density in the CVD layer could be controlled with high precision, the extended defect concentration was dominated by the quality of the substrate (in particular its extended defect density) and its surface finish.

The invention is a single crystal CVD diamond material with simultaneously controlled point defect density and low extended defect density and a method of producing said diamond.

The invention utilises high pressure-high temperature (HPHT) techniques to produce diamond substrates with low extended defect densities for subsequent CVD growth to yield CVD diamond with both low extended defect density and controlled point defect density, thereby addressing the four limitations of current technology (a) to (d) listed above.

According to the present invention, there is provided CVD material with an extended defect density as characterized by X-ray topography of below 400/cm², preferably below 300/cm², more preferably below 200/cm², most preferably less than 100/cm² over area of greater than 0.014 cm², preferably greater than 0.1 cm², more preferably greater than 0.25 cm², even more preferably greater than 0.5 cm², even more preferably still greater than 1 cm², and most preferably greater than 2 cm².

In CVD synthesis of diamond the direction of dislocations is typically close to the direction of growth, therefore a plane close to being perpendicular to the growth direction would normally be expected to contain the highest dislocation density. Preferably the extended defect density is characterized by X-ray topography for a plane which is oriented within approximately 5° of being perpendicular to the growth direction.

It is surprising that single crystal CVD diamond with such low densities of dislocation can be made, since this requires very low levels of dislocation nucleation at the interface. Contrary to the general understanding that there is always some dislocation nucleation at the interface, which would be large compared with the levels measured in the present invention, the present invention demonstrates that by using substrates with extremely low dislocation densities the occurrence of dislocation nucleation at the interface can be largely or totally prevented.

According to a further aspect of the present invention there is provided a CVD material with an optical isotropy as characterised using a 'Metripol' (Trade Mark) birefringence measurement instrument, of less than $1 \times 10^{-5}$ over a volume greater than 0.1 mm³, preferably greater than 0.5 mm³, more preferably greater than 1 mm³, more preferably greater than 3.4 mm³, more preferably greater than 8 mm³, more preferably greater than 27 mm³, more preferably greater than 64 mm³, more preferably greater than 125 mm³, more preferably greater than 512 mm³, more preferably greater than 1000 mm³.

The CVD diamond of this invention is grown on other diamond material which has been selected against specific criteria using X-ray and/or birefringence techniques. By using material selected according to the extended defect density and/or birefringence criteria described above (and explained in more detail below) as a substrate, not only is it possible to prepare material with exceptional crystalline quality, but also material containing a controlled density of point defects. For instance, material characterised as having birefringence (or optical isotropy) and extended defect density as defined above might also contain point defects such as nitrogen, boron, lithium, phosphorous etc which are compatible with the CVD growth process in the concentration range 0.1 ppb (parts per billion) to 10000 ppm (parts per million). In practice, for applications currently known to be of interest the nitrogen concentration will typically be controlled to be <10 ppm, more preferably <1 ppm and most preferably <0.01 ppm, and the atomic boron concentration might for some applications be less than 10 ppm, but in others to be >100 ppm, more preferably >500 ppm but most preferably >2000 ppm. To those skilled in the art it is obvious that these dopants and their concentrations might be controlled to within different limits depending on the nature of the application.

The CVD process offers solutions to all four issues associated with the HPHT process listed in the introduction. For example, single crystal CVD diamond can be doped with boron, by introducing some boron containing gas/compound into the CVD growth vessel. However, up until now the homoepitaxial nature of the process meant that, although the point defect density in the CVD layer could be controlled with high precision, the extended defect concentration was dominated by the quality of the substrate (in particular its extended defect density) and its surface finish.

The present invention also relates to a method of producing the single crystal diamond materials described above.

In particular, there is provided a method for producing a CVD single crystal diamond as defined above comprising the step of selecting a substrate on which to grow the CVD single crystal diamond, wherein the substrate has at least one of the following:

a. a density of extended defects as characterised by X-ray topography of less than 400/cm² over an area greater than 0.014 cm²;

b. an optical isotropy of less than $1 \times 10^{-5}$ over a volume greater than 0.1 mm³; and c. a FWHM X-ray rocking curve width for the (004) reflection of less than 20 arc seconds.

Preferably, the substrate upon which the single crystal CVD diamond of the present invention is grown is selected according at least two, preferably at least three of the criteria (a) to (c). Preferably the substrate selected meets the criteria (a), preferably (b), preferably (c), preferably (a) and (b), preferably (a) and (c), preferably (b) and (c), preferably (a), (b) and (c).

Preferably, the substrate selected has a density of extended defects as characterised by X-ray topography of less than 300/cm², preferably less than 200/cm², preferably less than 100/cm². Preferably, the area over which the extended defect are characterised is greater than 0.1 cm², preferably greater than 0.25 cm², preferably greater than 0.5 cm², preferably greater than 1 cm², preferably greater than 2 cm².

Preferably, the substrate selected has an optical isotropy of less than $5 \times 10^{-6}$, preferably less than $2 \times 10^{-6}$, preferably less than $1 \times 10^{-6}$. Preferably over a volume greater than 0.5 mm³, preferably greater than 1 mm³, preferably greater than 3.4 mm³, preferably greater than 8 mm³, preferably greater than 27 mm³, preferably greater than 64 mm³, preferably greater than 125 mm³, preferably greater than 512 mm³, greater than 1000 mm³.

Preferably, the substrate selected has a (004) X-ray rocking curve with a FWHM of 10 arc seconds or less, preferably 7 arc seconds or less, preferably 5 arc seconds or less, preferably 3 arc seconds or less, preferably 2 arc seconds or less, preferably 1.5 arc seconds or less preferably measured over an area of 1 mm×1 mm or greater, preferably 2 mm×2 mm or greater, preferably 4 mm×4 mm or greater, preferably 7 mm×7 mm or greater, preferably 15 mm×15 mm or greater.

The substrate selected preferably further has a lattice parameter which is matched to the lattice parameter of the subsequently overgrown single crystal CVD diamond of the present invention to within 1%, preferably to within 0.5%, preferably to within 0.2%, preferably to within 0.1%, preferably to within 0.05%, preferably to within 0.02%, preferably to within 0.01%, preferably to within 0.005%.

The single crystal diamond that comprises the substrate upon which the single crystal CVD diamond of the present invention is grown may be a natural diamond or a synthetic diamond. Preferably the substrate selected is a synthetic diamond. The synthetic diamond substrate may be produced by a CVD process or preferably a high pressure-high temperature (HPHT) process. The substrate selected may be CVD diamond, preferably a CVD diamond. The substrate selected may be high pressure-high temperature diamond, preferably a high pressure-high temperature diamond.

The invention utilises high pressure-high temperature (HPHT) techniques to produce diamond substrates with low extended defect densities for subsequent CVD growth. In this way, the present invention is able to yield CVD diamond with low extended defect density. Preferably, the CVD diamond produced also has controlled point defect density, thereby addressing the four limitations of the current technology (a) to (d) listed in the introduction above.

The substrate selected for use in the method of this invention may be grown using a method comprising the steps of:
- selecting a seed with a major face of the required orientation and having the desired perfection against criteria that might include type, shape, size, morphology, strain as deduced by birefringence and extended defect concentration as might be determined by X-ray topography,
- loading the seed (or seeds) with the major face oriented substantially parallel to the surface of a suitable support in such a way that the major face is substantially normal to the direction of the greatest flux of carbon nutrient species and will give rise to a preferred growth sector, preferably a central growth sector,
- carrying out growth in an HPHT environment for a sufficient time to ensure that a crystal of suitable size and height is grown,
- recovering the crystal,
- using X-ray or other suitable techniques to identify the locations of structural defects and the regions of highest crystalline perfection in the crystal,
- optionally annealing at elevated temperature this crystal under conditions of high pressure,
- selecting a nominally parallel sided slice or plate (based on X-ray or other suitable characterization) sufficiently far from the seed such that the plane of the plate will typically be parallel to the major face of the seed crystal and contain a proportion of the central growth sector originating from the preferred face of the original seed crystal, the plate including a zone of high crystalline perfection corresponding to the area where the plate intersects the preferred growth sector, and
- removing said chosen plate using techniques such as mechanical or laser sawing and preparing the surfaces using techniques such as lapping or scaif polishing,
- further enlarging and improving the zone of high crystalline perfection diamond in this plate by means of high temperature annealing under high pressure,
- using this zone of high crystalline perfection as a template or substrate for CVD growth, and
- optionally further improving crystalline quality in zone of high crystalline perfection by repetition of one or several of the above mentioned steps, The terms "high crystalline quality", "high crystalline perfection" and "exceptional crystalline quality" when referred to herein mean a single crystal or region of a single crystal wherein the extended defect density, preferably measured by X-ray topography, is less than 400/cm$^2$.

Preferably the chosen growth sector is either the cubic (001) growth sector or the octahedral (111) growth sector.

Other growth sectors that may be used are the (113) or {113} and the (115) or {115}.

According to a further aspect of the present invention, there is provided a method of growing a diamond crystal comprising the steps of:
- selecting a seed with a major face of the required orientation and having the desired perfection against criteria that might include type, shape, size, morphology, strain as deduced by birefringence and extended defect concentration as might be determined by X-ray topography,
- loading the seed (or seeds) with the major face oriented substantially parallel to the surface of a suitable support in such a way that the major face is substantially normal to the direction of the greatest flux of carbon nutrient species and will give rise to a preferred growth sector, preferably a central growth sector,
- carrying out growth in an HPHT environment for a sufficient time to ensure that a crystal of suitable size and height is grown,
- recovering the crystal,
- using X-ray or other suitable techniques to identify the locations of structural defects and the regions of highest crystalline perfection in the crystal,
- optionally annealing at elevated temperature this crystal under conditions of high pressure,
- selecting a plate (based on X-ray or other suitable characterization) sufficiently far from the seed such that the plane of the plate will typically be parallel to the major face of the seed crystal and contain a proportion of the central growth sector originating from the preferred face of the original seed crystal, the plate including a zone of high crystalline perfection corresponding to the area where the plate intersects the preferred growth sector, and
- removing said chosen plate using techniques such as mechanical or laser sawing and preparing the surfaces using techniques such as lapping or scaif polishing,
- further enlarging and improving the zone of high crystalline perfection diamond in this plate by means of high temperature annealing under high pressure,
- using this zone of high crystalline perfection as a template or substrate for CVD growth, and
- optionally further improving crystalline quality in zone of high crystalline perfection by repetition of one or several of the above mentioned steps, Preferably the chosen growth sector is either the cubic (001) growth sector or the octahedral (111) growth sector.

Preferably the support is a ceramic carrier (or seedpad).

For convenience, in the methods of the present invention, when the {001} growth sector is selected, the <001> direction most closely parallel to the direction of the temperature gradient or carbon concentration gradient of the growth capsule is defined as being the [001] direction and therefore the plane to which this is the normal as the (001) plane of the crystal.

Likewise, when the {111} growth sector is selected, the <111> direction most closely parallel to the direction of the temperature gradient or carbon concentration gradient of the growth capsule is defined as being the [111] direction and therefore the plane to which this is the normal as the (111) plane of the crystal.

Previous work suggested that there was no particular benefit obtained by precisely matching the lattice parameter of the diamond substrate for CVD growth to that of the subsequent CVD diamond growth. By careful pre-growth processing and etching of type Ib substrates, it was possible to grow thick layers of CVD material with extended defect densities that were moderately low (e.g. $10^3$-$10^4$ cm$^{-2}$) and not obviously correlated with the lattice parameter difference between the Ib substrate and the CVD layer. However, when combined with careful substrate surface preparation, and selection of substrate material with very low extended defect densities, it has been found that there was a benefit when the substrate material was also low in nitrogen impurities (ie type IIa material). The reason for this is as yet unclear but it is now known that the nitrogen content of the substrate has a significant impact on the effect of the pre-growth etching used to remove substrate processing damage and prepare the substrate surface for growth.

In the methods of the invention, type IIa diamond is preferably grown on a seed crystal by the temperature gradient method.

In the methods of the invention, the seed will preferably have a major face with a near planar surface of good finish (low roughness and low surface damage) and orientation close to the true crystal plane {001}. There are two ways in which this may be accomplished and both are presented. Firstly, the seed crystal may be sawn from a larger crystal of high crystalline perfection and further it should be sawn from a single growth sector of such a crystal. This has been argued, in for instance, U.S. Pat. No. 5,908,503 (Sumiya et al). This may then be referred to as a single sector seed with cubic morphology (all faces {100}). In practice, the seed must be generally sawn and the major face must be then polished. Inevitably this leads to misorientation and subsurface damage to the seed crystal with the result that the subsequent HPHT growth process is less effective. This difficulty may lead to the situation where the seed must first be partially dissolved in the solvent/catalyst metal before growth of a good quality crystal can start (as has been discussed in U.S. Pat. No. 4,836,881; Satoh and Tsuji). This type of processed seed may also be taken from a single crystal CVD diamond of suitably high crystalline perfection, as determined by methods such as x-ray topography.

Secondly, and alternatively, the seed may be a selected HPHT crystal of small size, such as 0.5 mm, that has been grown so as to achieve the presence of one or more major as-grown faces of good perfection. In the same way that, during growth of large diamond crystals (e.g. one carat or more), dislocations are largely confined to the <110> directions and the stacking faults lie in the {111} planes, it is found that during the growth of smaller crystals from a microscopic seed, the dislocations in such a crystal lie very largely in the eight spokes that represent the intersection of the {111} planes, and that there are relatively few dislocations in the (001) growth sector. Higher strain, as observed by polarised light microscopy, indicates that there are rays of dislocations generally along the lines of intersection of {111} planes but in directions which do not intersect the (001) cubic face, and that this cubic face can be selected so as to have higher perfection. In a similar way, an octahedral face of higher perfection may be selected by inspection and the use of crossed polarised light microscopy.

The seed might be processed or as grown, the material might be synthetic type Ib or IIa (HPHT or CVD) in origin, the preferred option being a seed that has low stress and also low, or no, surface defects. These criteria can be met by careful selection such as assessing the seed for stress using crossed polarised light microscopy or similar techniques (e.g. Metripol) and by processing using techniques such as scaif polishing, plasma processing, or reactive ion etching (RIE). A preferred method is to make use of selection methods in order to select near perfect crystals. The selection process is carried out in part during the processing of materials from the large volumes of crystals that are generated in the production of crystalline diamonds for abrasive applications. The selection is based on the following steps:

(1) Shape sorting so as to reject poor and cracked crystals,
(2) Magnetic sorting to reject crystals containing metallic inclusions,
(3) Sieve screening to ensure a narrow size range typically 500 to 550 microns,
(4) Visual sorting to reject poor surfaces, preferably with use of polarised light microscopy,
(5) Selection of suitable major (001) surfaces.

The seeds so selected may be processed further using cleaning processes such as the use of hot oxidizing acid mixtures.

In the methods of the present invention, the seeds may be annealed under stabilizing pressure at temperatures as high as 2500° C.

The above requirements on the seed can result in the selection of as few as 1 in 20000 (twenty thousand) crystals as being suitable for a seed.

In HPHT synthesis of single crystal diamond material, HPHT-grown diamond seed crystals are generally pressed into a seed pad in a way such that a major face of the seed lies in the plane of the surface of the seed pad. Our research on synthesis and characterisation of HPHT synthetic diamond material teaches us that in order to produce HPHT-grown diamond material that is of high crystalline quality, it is important to start from a seed which has a major face that has a crystallographic orientation such that, in subsequent growth, extended defects (such as dislocations and stacking faults) do not propagate normal to that major face. If this condition is met any extended defects that either nucleate at the seed surface or thread though from within the seed will propagate away from the central region of the subsequently grown material, leaving it relatively free of extended defects. If the material is grown to a thickness (measured in the direction normal to the major face of the seed crystal) that is large compared to the lateral dimensions of the seed crystal, the last material to be grown will have a relatively large central region, opposite the seed, that is free of extended defects that emanate from the seed or its surface (see FIG. 1).

It is advantageous if the directions of propagation of structural defects have only small components parallel to the normal of the seed crystal's major face. The smaller these components are, the more rapidly the area free of extended defects emanating from the seed will increases in area as the crystal is grown thicker.

Under typical conditions used for HPHT synthesis of diamond material, dislocations tend to propagate in directions close to <110> and stacking faults lie in {111} planes.

This means, for example, that a {110} oriented surface is a poor choice for the major face of a seed crystal because dislocations would propagate normal to the {110} surface of the seed crystal and, in addition, two of the {111} stacking fault planes would be perpendicular to the {110} surface of the seed crystal.

The {001} is a relatively good choice for the major face of a seed crystal. There are two <110> directions that lie in the {001} plane and two that lie at an angle of 45.0 degrees to it. This means that dislocations that nucleate at the seed surface or thread through from within the seed will propagate out sideways away from the central region of growth as the crystal is grown thicker. The normal of the {001} surface lies at an angle of 35.3 degrees relative to each of the {111} stacking fault planes and therefore stacking faults will also propagate out sideways as the crystal is grown thicker, leaving a central region of growth which is free of both dislocations and stacking faults emanating from the substrate or its surface.

Similar arguments can be applied to growth on {111} surface. The angle between the <110> dislocation directions and the normal to the {111} surface is 35.3 degrees. The normal of the {111} surface lies at an angle of about 19.5 degrees relative to three of the {111} stacking fault planes. Thus both stacking faults and dislocations are expected to propagate away from the central region above the seed as the crystal grows thicker. Clearly the smaller angle for the stacking faults means that the area of the higher crystal quality central region increases more slowly with thickness than for a {100} surface.

This teaching must be combined with the ability to grow diamond material in which extended defects such as dislocations and stacking faults do not nucleate with a high frequency. Dislocations might nucleate within growing material when foreign material becomes included in the crystal, for example. Our research has indicated that the likelihood of stacking fault nucleation is higher for <111> growth sectors than other sectors. For that reason, with a {001} major seed face it is additionally advantageous to choose growth conditions that cause the central <001> growth sector and any minor sectors (such as <511> and <311>) that surround it to enlarge as rapidly as possible as the sample grows thicker. This reduces the effect of stacking fault and dislocation nucleation within <111> sectors.

For many applications, including the use of this HPHT material as a substrate for subsequent CVD diamond growth, it is desirable to have type IIa material. The required exclusion of nitrogen makes it harder to simultaneously achieve high growth rates and to control the morphology such that the growth of the lower crystal quality <111> sectors is minimised and that a region of high crystalline quality of significant area can be achieved in the minimum possible time.

The regions of high crystalline quality can be identified directly using X-ray projection topography that allows stacking faults and dislocations to be directly imaged. Under some conditions it is possible to choose the region for production of high crystalline quality material by imaging the diamond using DiamondView™. This device uses above band gap radiation to excite luminescence caused by low concentrations of point defects in the material. These defects are incorporated at different rates on different growth surfaces and this gives rise to differences in the photoluminescence from different growth sectors. In so far as there is a correlation between the growth sectors and the regions of high crystalline quality (as described above), DiamondView™ can be used to allow the selection of the central [001] growth sector and the minor sectors surrounding it for production of high crystalline quality plates that exclude the lower quality <111> growth sectors.

The area of the high crystalline quality region can be increased by HPHT annealing (at 2200° C. or at higher temperatures under diamond stabilising pressure) to reduce the number of stacking faults in the <111> growth sectors. When the crystal quality of the <111> growth sectors has been improved by annealing in this way it is advisable to use x-ray topography that directly images the extended defects to select the appropriate area for processing samples. DiamondView™ imaging will no longer be so reliable for optimising the chosen area because it will now be desirable to include material from <111> growth sectors.

The removal of the stacking faults by HPHT annealing could be due to one of (or a combination of) several physical processes. The pressure exerted on the diamond sample inside the HPHT capsule is unlikely to be perfectly hydrostatic (equal in all directions). This is supported by the fact that some diamond samples annealed in our capsules, in which the sample length in one dimension is greatly different to the length in the other two, have a propensity to crack. Given this, there is then likely to be a resolved shear stress on the {111} planes on which the stacking faults exist. Since stacking faults are in general bounded by partial dislocations, the shear forces present, in combination with the high temperature, could cause these dislocations to move in such a manner that the stacking faults are eliminated. One way in which this could occur is by glide: the shear force causes glide of a partial dislocation across the {111} glide plane containing the stacking fault, thereby correcting the error in the lattice. That the sample is also at high temperature would likely increase the glide velocity, thus increasing the chances of producing an observable effect. Another way in which pressure and temperature could cause motion of the dislocations bounding the stacking fault is by climb: the high temperature increases the rate of absorption or emission of vacancies or interstitials required to move the dislocations non-conservatively. In this way, it could be envisaged that the boundaries of the stacking faults shrink completely, thus removing the fault. Stacking faults are metastable arrangements of the crystal so their removal lowers the total energy of the crystal.

The grown and annealed diamond is thereafter subject to further scrutiny using X-ray topography and/or birefringence techniques and criteria. This analysis is used to identify areas with the lowest number of defects. On the basis of this, material is isolated, processed and used as substrate material for chemical vapour deposition overgrowth.

CVD methods for synthesizing intrinsic, B and N doped diamond are detailed in patent publications WO01/96633, WO01/96634, WO03/052174 and WO03/052177, the contents of which are incorporated herein by reference. These methods, combined with steps in this invention, render possible a new material with specifically controlled point defects but which also has exceptionally low extended defect concentration.

The resulting CVD material of this invention might be further refined by repeating some or all of the abovementioned steps.

As a result of the methods of this invention, CVD diamond material can be prepared where the point defect concentration is controlled depending on the intended application of the material and the extended defect density is reduced below levels previously thought possible.

It will be appreciated that the material according to the present invention will find particular use in a number of applications.

Optical Application Motivation

There is a range of optical devices which, as a result of their unique requirements, place high demands on the material used for them. Examples include laser windows, where high intensity beams need to pass undisturbed through a window which is required to provide some form of isolation, and other devices such as optical reflectors, diffraction gratings and etalons.

Depending on the particular application, key properties that may play a role in the selection or manufacturing of an appropriate material include low and uniform birefringence, uniform and high refractive index, low induced birefringence or refractive index variation as a function of strain, low and uniform optical absorption, low and uniform optical scatter, high optical (laser) damage threshold, high thermal conductivity (minimising temperature variation within the optical element), an ability to be processed to show a high surface polish together with high parallelism and flatness, mechanical strength, abrasion resistance, chemical inertness, and repeatability in the material parameters so that it is reliable in the application.

By way of an example, the birefringence property is a measure of the optical isotropy of the material. Diamond is a cubic material and by definition this means that perfect diamond is optically isotropic (ie showing no birefringence). However in practice the isotropy is disturbed by defects that introduce strain into the lattice. If the strain is homogeneous then the material remains optically uniform. Such a uniform strain might be associated with a uniform density of point defects, such as that which might be introduced by nitrogen or boron containing diamond, where the nitrogen and/or boron defects are present but are evenly distributed through the bulk of the diamond. However, in practice defects such as stacking faults and dislocations often give rise to non-uniform strain. Minimizing these types of defects is achieved in material prepared according to the methods of this invention, thereby providing material giving improved performance in the intended application.

Electronic Application Motivation

The intrinsic properties of diamond make it a potentially useful material for certain extreme electronic applications, particularly in terms of high power, high frequency, radiation hardness and high temperature electronic applications. In each of these areas there are basically two key parameters that represent the ultimate limit in performance. The first is carrier mobility, a measure of how easily a current can flow through the material, and the second is how high a voltage the diamond can withstand when there is no source of current carriers. To maximize the carrier mobility, it is critical that both the extended and point defect density are controlled to minimize carrier scattering and maximize the current. The method of this invention is crucial to maximizing this parameter as it simultaneously minimises the extended defect density and controls the point defect density. It is well known in other materials that extended defects such as dislocations can lead to voltage breakdown below the material's intrinsic limit. Again, the method of this invention for the material of this invention enables voltage hold off to be maximized. Specific examples of applications include high voltage diodes and high power-high frequency field effect transistors.

Other Example Applications

It is obvious to those in the field that the material of this invention will have many benefits in other applications. Such as for example, mechanical wear applications where any non-uniformity in the material or stress might lead to reduced lifetime.

Although some CVD processes allow the growth of diamond to thicknesses in excess of several millimeters, using a typical type Ib substrate does not allow the attainment of the levels of crystalline perfection attainable using the current invention. Further, there are some CVD processes for diamond synthesis which are much more sensitive to the presence and propagation of structural defects in the growing material. For such processes, structural defects may multiply as the layer grows thicker causing a gradual loss of quality with thickness, even ultimately limiting the thickness to which homoepitaxial growth is possible. For such processes it is advantageous to use substrates of high crystalline perfection as possible, such as those used in the current invention or such as could be produced from the CVD material of the current invention. In other words, the use of substrate of high crystalline perfection widens the CVD process window for the synthesis of thick high quality material.

Synthetic diamond material of high crystalline perfection of the current invention may also be of value for ornamental applications such as jewellery.

Other applications include the use of the material of the invention as a window and/or detector material in monitoring and controlling x-ray synchrotron radiation. The most important trend in synchrotron radiation x-ray sources is towards higher brilliance, i.e. higher rate photon streams out of smaller optical source sizes, in smaller solid angles and shorter pulses, leading to a very high power density, of the order of hundreds of watts per square millimeter at the beam optical elements. The beam optical elements are typically windows, polarisers, filters and monochromators. The elements most likely to suffer from the high power density are the first monochromator crystal (normally in a double crystal set-up and often cooled with liquid nitrogen) and the window(s) between source and monochromator, which is the first to be hit by the x-ray beam. When using the currently preferred material, silicon, which can be grown to a very high crystalline perfection, it is possible to build optical elements that preserve transversal coherence of the x-ray beam which is important for phase sensitive imaging experiments like holotomography, x-ray photon correlation spectroscopy or coherent diffraction imaging. Diamond would be the preferred material because of its thermal properties and damage resistance if the crystal perfection (both bulk and surface) could be improved [G. Grubel, D. Abernathy, G. Vignaud, M. Sanchez del Rio and A. K. Freund, "A diamond double-crystal transmission monochromator", Rev. Sci. Instrum. 67 (9) 1996, 1-4.]

DETAILED DESCRIPTION OF PREFERRED EMBODIMENTS

During the HPHT synthesis process it has been found that there is a correspondence between the growth sectors of the seed crystal and the regions of higher perfection in the grown crystal.

More specifically, the region of highest perfection corresponds to the upper, near-horizontal, growth sector. In this specification the term 'upper' refers to that region of a grown crystal most remote from the seed crystal and the term 'horizontal' refers to a plane substantially parallel to the orientation of the seed crystal and/or the plane of support of the seed crystal.

It is advantageous if the directions of propagation of structural defects have only small components parallel to the normal to the seed crystal's major face. The smaller these components are, the more rapidly the area free of extended defects emanating from the seed will increase in area as the crystal is grown thicker.

We have found that under typical conditions used for HPHT synthesis of diamond material, dislocations tend to propagate in directions close to <110> and that stacking faults lie in {111} planes.

This means, for example, that a {110} oriented surface is a poor choice for the major face of a seed crystal because dislocations would propagate normal to the {110} surface of the seed crystal and, in addition, two of the {111} stacking fault planes would be perpendicular to the {110} surface of the seed crystal. Thus a region of low extended defect density would never be formed.

The above technique must be combined with the ability to grow diamond material in which extended defects such as dislocations and stacking faults do not nucleate with a high frequency. Dislocations might nucleate within growing material when foreign material becomes included in the crystal, for example. Our research has indicated that the likelihood of stacking fault nucleation is higher for <111> growth sectors than other growth sectors. For this reason, when using a seed with a {001} major face, it is additionally advantageous to choose growth conditions that cause the central <001> growth sector and any minor sectors (such as <511> and <311>) that surround it to enlarge as rapidly as possible as the sample grows thicker. This reduces the effect of stacking fault and dislocation nucleation within <111> growth sectors.

For many applications, including the use of the material as a substrate for CVD diamond synthesis, it is desirable to have type IIa material. The required exclusion of nitrogen makes it harder to simultaneously achieve high growth rates and to control the morphology to minimise the extent of growth on the lower crystal quality <111> growth sectors in order to obtain a high crystalline quality region of significant area in the minimum possible time.

The location of the regions of high crystalline quality can be assessed directly using X-ray projection topography, allowing stacking faults and dislocations to be directly imaged. When there is confidence that the central sector is of high crystalline quality because of the reasons given above, it is possible to choose the region for production of high crystalline quality material by imaging the material using DiamondView™. This uses above band gap radiation to excite luminescence caused by low concentrations of point defects in the material. These defects are incorporated differently on the different growth surfaces and this gives rise to differences in the photoluminescence from different growth sectors. In so far as there is a correlation between the growth sectors and the regions of high crystalline quality (as described above), DiamondView™ can be used to allow the selection of the central <001> growth sector and the minor growth sectors surrounding it for production of high crystalline quality plates that exclude the lower quality <111> growth sectors.

We have shown that the area of the high crystalline quality region can be increased by HPHT annealing (for example at 2200° C. under diamond stabilising pressure) that removes stacking faults in the <111> growth sectors. When the crystal quality of the <111> sectors have been improved by annealing in this way it is advisable to use X-ray topography that directly images the extended defects to select the appropriate area for processing samples. DiamondView™ imaging will no longer be so reliable for optimising the chosen area because it will now be desirable to include material from <111> sectors.

Removal of the stacking faults could be due to one of (or a combination of) several physical processes. The pressure exerted on the diamond sample inside the capsule is unlikely to be perfectly hydrostatic (equal in all directions). This is supported by the fact that some diamond samples annealed in our capsules, in which the sample length in one dimension is greatly different to the length in the other two, have a propensity to crack. Given this, there is then likely to be a resolved shear stress on the {111} planes on which the stacking faults exist. Since stacking faults are in general bounded by partial dislocations, the shear forces present, in combination with the high temperature, could cause these dislocations to move in such a manner that the stacking faults are eliminated. One way in which this could occur is by glide: the shear force causes glide of a partial dislocation across the {111} glide plane containing the stacking fault, thereby correcting the error in the lattice. That the sample is also at high temperature would likely increase the glide velocity, thus increasing the chances of producing an observable effect. Another way in which pressure and temperature could cause motion of the dislocations bounding the stacking fault is by climb: the high temperature increases the rate of absorption or emission of vacancies or interstitials required to move the dislocations non-conservatively. In this way, it could be envisaged that the boundaries of the stacking faults shrink completely, thus removing the fault. Stacking faults are metastable arrangements of the crystal so if you remove these you lower the total energy. Stacking faults are metastable arrangements of the crystal so it is energetically favourable for them to be removed.

Where a seed is used with an upper face corresponding to the <001> crystal direction, the zone of higher perfection corresponds very largely to the <001> growth sector.

Preferably, the desired growth region of high crystalline perfection in the grown crystal is selected by x-ray topography, although it is also found that there is a correspondence between the growth sectors and the zones of higher perfection in the crystal as delineated by ultraviolet luminescence.

In practice it is also found that the neighbouring <115> and <113> growth sectors can also have a low density of extended defects in comparison to the <111> growth sectors.

The perfection of the crystal and the area of the highest quality region may be increased by annealing the synthetic diamond crystals having such high crystalline perfection at the upper, near horizontal, region of the growth zone parallel to the orientation of the crystal.

Crystal growth conditions may be selected to enhance the growth of the near horizontal growth region, to thereby increase the volume of the growth region having high crystalline perfection.

Preferably, the crystal growth conditions that are selected to enhance the growth of the near horizontal growth region are one or more of the following: the pressure and temperature conditions, the use of an additive or additives known in the art, the use of large seeds with large faces corresponding to the desired growth sector, or the use of a heat sink insert directly below the growing diamond.

The growth region is typically in the upper, more preferably near horizontal part of the grown crystal. Preferably, the method according to this aspect of the present invention includes the step of using x-ray topography to select a preferred region. This has been found to be correlated with details observed in photoluminescence and birefringence. Under ideal conditions it is desirable to only use this central region in the further aspects of this invention. However, because of the limited size of this area it may be necessary to use some of the outer <111> growth sectors. It is the stacking faults in these growth sectors which we find can generate dislocations in the subsequent CVD layer. These stacking faults can be reduced in size, displaced or even removed by a high temperature annealing process. The exact mechanism whereby these are removed is not clear, but it is thought that the process results in increasing the density of the diamond, removing the ABCACABC fault to give ABCABCABC. The detailed mechanism whereby this occurs is not certain; however it is thought that non-hydrostatic forces are present in the annealing capsule which lead to shear forces that play an important role in this process.

Stacking faults can either consist of a localised region where there is a missing plane in the structure disrupting the stacking sequence to . . . ABCACABC . . . (where the missing plane is the B plane where the sequence is AC) or consist of a localised region where there is an extra plane in the structure disrupting the stacking sequence to . . . ABCABACABC . . . (where the extra plane is the A plane where the sequence is BAC). In both cases removing the stacking fault results in the stacking sequence reverting to . . . ABCABCABC . . . .

The prior art suggests that there was no particular benefit of lattice parameter matching. By careful pre-growth processing and etching of type Ib substrates, it was possible to grow thick layers of CVD material with dislocation contents that were moderately low ($10^3$-$10^4$ $cm^{-2}$) and not directly correlated with lattice parameter difference between the substrate and the CVD layer. It was only when attempts were made to select substrate material with very low dislocation density that it was found that there was only a benefit when this material was also low in nitrogen impurities. The reason for this is as yet unclear but it is known that the nitrogen content of the substrate has a significant impact on the effect of the pre-growth etching used to remove substrate processing damage and prepare the substrate surface for growth.

In a preferred embodiment of the invention, the type IIa diamond is grown on a seed crystal by the temperature gradient method. The seed will preferably be single sector with cubic morphology (all faces {100}). The seed might be processed or as grown, the material might be synthetic type Ib or IIa (HPHT and CVD) in origin. The preferred option being low stress with no surface defects type IIa. These criteria can be met by careful selection such as assessing the seed for stress using Metripol etc and processed using techniques such as scaif polishing, plasma processing, reactive ion etching (RIE), inductively coupled plasma etching (ICP), ion beam machining (IBM). In one variant of the invention the seed might be annealed under stabilizing pressures at temperatures as high as 2400° C.

The temperature gradient method of producing the synthetic type IIa diamond involves providing a reaction mass of a source of carbon separated from seed crystals by a mass of solvent/catalyst and subjecting the contents of the capsule to conditions of elevated temperature in the diamond stable range such that a temperature gradient is established between the carbon source and the seed, with the seed being at the low end of this temperature gradient. A nitrogen getter is used to reduce the nitrogen content of the grown diamond.

In HPHT synthesis of single crystal diamond material, HPHT-grown diamond seed crystals are generally pressed into a seed pad in a way such that a major face of the seed lies in the plane of the surface of the seed pad. Our research on synthesis and characterisation of HPHT synthetic diamond material teaches us that in order to produce HPHT-grown diamond material that is of high crystalline quality it is important to start from a seed which has a major face that has a crystallographic orientation such that, in subsequent growth, extended defects (such as dislocations and stacking faults) do not propagate normal to that major face. If this condition is met any extended defects that either nucleate at the seed surface or thread though from within the seed will propagate away from the central region of the subsequently grown material, leaving it relatively free of extended defects. If the material is grown to a thickness (measured in the direction normal to the major face of the seed crystal) that is large compared to the lateral dimensions of the seed crystal, the last material to be grown will have a relatively large central region, opposite the seed, that is free of extended defects that emanate from the seed or its surface (see FIG. 1).

These seeds might be HPHT, natural or SC CVD diamond. Careful selection and preparation ensures that the seed is low stress (as exemplified by birefringence measurements) and has a low damage surface for growth upon which growth can be nucleated. In one aspect of the invention this seed will be annealed, or even be produced from the final object in an iterative process.

In one preferred form of the invention, the carbon source and solvent/catalyst are treated to reduce the nitrogen content as far as possible and preferably below 1 ppm. This can be achieved by, for example, treatment at high temperatures, typically greater than 1100° C., and high vacuums, typically better than $10^{-5}$ mbars, followed by encapsulation in a suitable refractory metal container that acts to prevent the readmission of nitrogen during the HPHT synthesis process. Tantalum metal canisters are one example of such a container.

The carbon source may be any known in the art including diamond which may be CVD, HPHT, natural diamond or graphite but is preferably CVD diamond.

The solvent/catalyst may be any known in the art but is preferably cobalt, iron or nickel or combinations of two or more such metals or alloys containing one or more such metals. In order to ensure type IIa character in the diamonds produced, the alloy preferably contains a minor component selected from the metals zirconium, titanium, aluminium, and cerium, for example. Further, the alloy components are preferably pre-alloyed prepared and purified by methods known to those schooled in the art so as to ensure growth of diamond crystals of adequate clarity, in the sense of elimination of metal inclusions.

The HPHT process is carried out at pressures of from 5 to 6 GPa and at temperatures from 1260° C. to 1600° C., but more preferably from 1280° C. to 1330° C., with appropriate systems for the stabilisation of pressure and temperature during the process. The time of growth may extend from a few tens of hours to a few hundreds of hours depending upon the size of crystal desired, but is typically 200 hours.

After growth the crystals are released from the solidified matrix of solvent/catalyst metals and selected for crystal quality and for the existence of an external morphology that indicates the prevalence of the preferred growth sector, most typically the (001) or cubic growth sector. Plates of thickness from 0.1 to 1 millimeters thickness are sawn from the crystal where the direction of sawing is selected so as to maximise the dimensions of the plate and the presence of the preferred growth sector. Sawing may be done using the conventional diamond sawyers' blade, a phosphor-bronze disc impregnated with fine diamond particles, or by means of a laser sawing system where the laser is typically a neodymium YAG laser operating at a wavelength of 1064 nm. Finally the sawn plates are examined using DiamondView™ or an equivalent ultraviolet fluorescence microscope for the existence of well defined growth sectors, including the preferred sector that has been grown from the selected seed face.

In order to carry out the annealing process, diamond samples are compacted into a cylindrical disc of low-shear strength material (such as an alkali-halide) in such a way that they are completely enclosed within the packing medium. The disc, which now contains the samples to be treated, is then encapsulated within a graphite container, which is in turn encased within two tantalum cups.

The container is then loaded into a HPHT (high pressure-high temperature) chamber, which is designed to fulfil the functions of pressure chamber and furnace for the attainment of the extremely high pressure and temperature conditions required.

A HPHT press of the belt type is an example of a HPHT system that can be used for carrying out the annealing step. It is to be understood, however, that other HPHT systems can also be used, provided they are able to achieve the required high pressure and temperature conditions. However a system which provides a stress field in which the shear stress component is very small may not be suitable for the reasons previously disclosed.

Typical conditions for heating these structures are temperatures of 1600° C. to 2500° C., preferably >2200° C., with stabilising pressures ranging between 6.0 and 8.0 GPa, preferably about 7.5 GPa. Treatment times may vary between 0.1 and 48 hours, but would preferably be 4 hours. As it seems that the annealing mechanism may be related to shear forces present in the capsule, the precise details of pressure and temperature may depend on the geometry of the sample, for instance annealing plates where one dimension is much smaller than the other two may require different pressure and temperature conditions to when the annealing is applied to a more cubic shape.

An important aspect of the present invention is the improvement of the crystalline perfection of a synthetic diamond, more especially a type IIa synthetic diamond. The improvement of the lattice perfection of a synthetic type IIa diamond can be measured by methods such as X-ray topography, X-ray rocking curve width measurements, or direct measurement of the density of extended defects or dislocations and other defects which provide visible contrast in X-ray topographs. These dislocation densities are typically expressed in units of dislocations per square cm of image area. An improvement in terms of the invention would be the reduction from a level of 100,000 dislocations per cm$^2$ to a level of below 500 dislocations per cm$^2$. Using a rocking curve width method, an improvement would typically be represented as a reduction in the full width at half maximum from a value of approximately 7 arc seconds (where an arc second is 1/60 of an arc minute and an arc minute is 1/60 of an angular degree) to a value approaching the theoretical limit for diamond which is 1 arc second.

Preliminary investigation of the structural defect content of diamond samples can be carried out using X-ray section topography. X-ray topographs were recorded, with a 0.25 mm slit width, on Ilford L4 nuclear emulsion using Mo K$\alpha_1$ radiation (wavelength: 0.070926 nm) from a Marconi GX20 rotating anode X-ray generator. With this wavelength, use of the <533> reflection allows diamond samples to be set up so that the plane sampled by the x-ray beam was very close to a cube {100} plane. It also allowed topographs to be recorded with relatively little projection distortion because, at 81.37°, 2θ for the Bragg condition was fairly close to 90°.

Preferably the extended defect density is less than 400/cm$^2$ over an area greater than 0.014 cm$^2$ as characterised by X-ray topography, carried out under conditions where either the Burgers vector of individual extended defects can be determined or where individual extended defects can be distinguished, such as, for example, using a 0.25 mm slit width, on Ilford L4 nuclear emulsion using Mo K$\alpha_1$ radiation (of wavelength 0.070926 nm) from a Marconi GX20 rotating anode X-ray generator. This measurement is made using a topographs of an appropriate reflection. Examples of reflections which may be appropriate for making this measurement include the {533} and {111}.

For more detailed investigation of the extended defect content of diamond samples, x-ray projection topography can be carried out. This gives more complete information on the dislocation content throughout the complete volume of a sample. This information includes the spatial distribution of the dislocations and their line direction. By comparison of the contrast caused by individual dislocations in topographs generated using different X-ray reflections it is also possible to characterize dislocations in terms of the their Burgers vectors. For Burgers vector analysis of dislocations within a sample, X-ray projection topographs were recorded for each of the four different <111> reflections. Dislocations in diamond generally have Burgers vectors along <110> directions. The six different <110> directions are given by the lines along which two different kinds of {111} planes intersect. To a good approximation, dislocations are invisible in a given topograph if their Burgers vector lies parallel to the atomic planes that are diffracting the X-rays. This means that for a set of four topographs, each generated using a different <111> reflection, a given dislocation should be present in two topographs but absent from the other two topographs, with the Burgers vector given by the line of intersection of the diffracting planes for the two topographs for which the dislocations are absent.

Stacking faults in a diamond crystal lie in {111} planes and give rise to a distortion of {111} atomic planes of the crystal. By recording x-ray projection topographs for each of the four {111} reflections we can therefore be sure that the results will show contrast from all stacking faults in the crystal.

Using {111} diffraction had the following additional advantages in this work. It is a strong reflection and allows four equivalent views of parallel-sided (001) plate samples, recorded using the four different {111} reflections. With Mo K$\alpha_1$ radiation, it gives a near plan view which allows individual threading dislocations to be observed in a direction close to their line direction.

X-ray topography applied in this way has allowed the following results of relevance to this invention to be obtained. As-grown diamond material produced by HPHT synthesis has been characterized to ascertain its content of extended structural defects (both dislocations and stacking faults). In this way samples showing high crystalline perfection have been chosen and the regions showing the lowest content of structural defects have been selected for making into substrate for subsequent CVD diamond synthesis. The quality of CVD diamond layers grown on type IIa substrates selected in this way was limited by the fact that dislocations nucleated where stacking faults in the <111> growth sectors of the substrates broke the initial surface presented for CVD growth.

If CVD growth takes place homoepitaxially on the surface of a diamond substrate that has stacking faults breaking it, as growth proceeds, structural defects propagate into the CVD layer from where the stacking faults reach the substrate surface. When selecting material suitable for processing into substrates, it is therefore advantageous to have a simple method for characterising stacking fault content and spatial distribution. Such a technique should give not only information on which samples are suitable but also on the best regions in the sample for processing substrates.

X-ray topography can be used but, where this technique is not available or too time consuming, birefringence microscopy can give helpful information. As-grown type IIa HPHT synthetic diamond samples tend to be cubo-octahedral in morphology and the stacking faults tend to be confined to the <111> growth sectors. The birefringence caused by a stacking fault is most clearly seen when viewed though parallel flat sides of a sample and with a viewing direction that is parallel to the plane of the stacking fault. For a cubo-octahedral sample grown from a {100} oriented seed (for example) such a viewing condition can be achieved if a pair of {110} windows is polished on opposite sides of the sample, perpendicular to the plane of the seed. It is generally possible to polish two such pairs of {110} windows that together allow stacking faults in all of the {111} sectors to be viewed parallel to their plane using crossed polariser microscopy.

When samples are viewed in this way through crossed polarisers, the birefringence relating to a stacking fault is most clearly seen when the two polarisers are at 45 degrees to the plane of the stacking fault. In addition, it has been found that stacking faults are most clearly seen when the focal plane of the microscope runs through the stacking fault. The variations in the visibility of stacking fault birefringence that are seen as the focus plane of the microscope is scanned though the sample from one window to the other therefore allows the depth of the stacking fault to be judged.

When HPHT-synthesized type IIa diamond material was annealed at 2200° C. under diamond stabilizing pressure, it was found that the stacking fault content was substantially reduced as judged by the X-ray topography techniques detailed above, making it possible to produce {100} substrates in which stacking faults no longer broke the initial growth surface. This in turn made it possible to grow CVD diamond layers of higher crystalline quality than has previously been possible.

At the same time X-ray topographs have indicated that, with the use of type IIa substrates of low structural defect content, it is possible to significantly reduce the number of dislocations that nucleate, in the CVD process, at or near the interface with the substrate.

CVD methods for synthesizing intrinsic, B and N doped diamond are detailed in patent publications WO01/96633, WO01/96634, WO03/052174 and WO03/052177, the contents of which are incorporated herein by reference. These methods, combined with steps in this invention, makes possible the synthesis of a new material with specifically controlled point defects but with exceptionally low extended defect density.

The use of the current invention has resulted in CVD diamond with an extended defect density as characterized by X-ray topography of less than $400/cm^2$, $300/cm^2$ and $200/cm^2$ and $100/cm^2$ over areas of greater than 0.014, 0.1, 0.25, 0.5, 1 and 2 $cm^2$.

Reducing the structural defect content of the CVD layer makes it easier to grow material with uniform boron content because where structural defects break the growth surface they tend to cause deviations in surface orientation of the CVD growth surface and these deviations in surface orientation, in turn, cause local variations of the incorporation efficiency of boron and therefore a reduction in the uniformity of the boron concentration.

Birefringence

For an isotropic medium, such as stress-free diamond, the refractive index is independent of the direction of the polarization of incident light. If a diamond sample is inhomogeneously stressed, either because of grown-in stress or local defects or because of externally applied pressure, the refractive index is anisotropic (that is the material can become optically anisotropic). The variation of the refractive index with direction of polarization may be represented by a surface called the optical indicatrix that has the general form of an ellipsoid. The difference between any two ellipsoid axes is the linear birefringence for light directed along the third. This may be expressed as a function involving the refractive index of the unstressed material, the stress and opto-elastic coefficients of the material.

It is possible to measure birefringence of a material in a number of ways. For example, birefringence may be measured using the conventional technique of polarimetry LP-S-LA (linear polariser-specimen-linear analyser) in which polarisers and compensating optical elements are inserted into the light path, but the resolution of such techniques is relatively low.

A more sophisticated technique with considerably higher resolution, RLP-S-CA (rotating linear polariser-specimen-circular analyser), has been developed in which the sample is illuminated in transmission with linearly polarised light (preferably monochromatic) the plane of polarisation of which is rotated. After passing through an anisotropic sample, the light is analysed with a circular analyser consisting of a polariser and a quarter-wave-plate. A CCD camera is used to image the sample, the digital output of which can be subjected to further processing. RLP-S-CA has been implemented as a commercial system, 'Metripol' (Oxford Cryosystems) and disclosed in GB2310925. RLP-S-CA, and the "Metripol", gives information on how the refractive index at a given wavelength depends on polarization direction in the plane perpendicular to the viewing direction. An explanation of RLP-S-CA and how "Metripol" in particular works is given in A. M. Glazer et al. in Proc. R. Soc. Lond. A (1996) 452, 2751-2765.

The RLP-S-CA method as used in Metripol determines the direction of the "slow axis", i.e. the polarization direction in the plane perpendicular to the viewing direction for which the refractive index is a maximum. It also measures $|\sin \delta|$ where $\delta$ is the phase shift given by $$\delta = (2\pi/\lambda)\Delta nL$$

where $\lambda$ is the wavelength of the light, L is the thickness of the specimen and $\Delta n$ is the difference between the refractive index for light polarized parallel to the slow and fast axes i.e. the birefringence. $\Delta nL$ is known as the 'optical retardation'. $\Delta nL$ is a property of a particular sample of a material (since it is dependent on the thickness of the sample). $\Delta n$ is a property of the material (since it is independent of the thickness of the sample).

For retardation in first order, with L=0.6 mm and $\lambda$=589.6 nm, then: when $\sin \delta = 1$ and $\Delta n L = \lambda/4$, it can be deduced that $\Delta n = 2.45 \times 10^{-4}$. when $\sin \delta = 0.5$ and $\Delta n L = \lambda/12$, it can be deduced that $\Delta n = 0.819 \times 10^{-4}$.

Since the single crystal CVD diamond of the present invention is a bulk material rather than a film of infinitesimal thickness, the value of $\Delta n$ obtained from a given point on a sample is in reality the average of all the instantaneous values of $\Delta n$ along the relevant optical path through the sample. To emphasise this distinction, $\Delta n$ may be referred to as $\Delta n_{[average]}$. It should be made clear that $\Delta n_{[average]}$ is not an average value for an area perpendicular to the optical path.

The RLP-S-CA method as used in Metripol produces three colour-coded (that is false colour) images showing the spatial variations of a) the orientation of the "slow axis", b) $|\sin \delta|$ and c) the transmitted intensity of the material in the absence of birefringence at the wavelength of operation.

Samples for birefringence measurement are prepared as optical plates of known thickness and analysed over an area of at least 1.3 mm×1.3 mm, and preferably at least 2.5 mm×2.5 mm, and more preferably at least 4 mm×4 mm. $|\sin \delta|$ images produced by the RLP-S-CA method as used in Metripol are then analysed and the maximum value of $|\sin \delta|$ in each frame (or image) over the whole of the analysis area is recorded. From the set of frame-by-frame maximum $|\sin \delta|$ values and the measured thickness of the sample, the maximum value of $\Delta n$ (that is $\Delta n_{[maximum]}$) can be determined for the whole of the area analysed.

The behaviour of $|\sin \delta|$ is the property of a particular plate of material, constrained here to plates of useful thickness by application of a minimum thickness. A more fundamental property of the material can be obtained by converting the $\sin \delta$ information back to values averaged over the thickness of the sample of the difference between the refractive index for light polarised parallel to the slow and fast axes, $\Delta n_{[average]}$.

Instrument resolution and noise set a lower limit to the value of $|\sin \delta|$ and hence the minimum optical retardation $\Delta nL$ that can be measured, for example by "Metripol". This in turn sets a lower limit on the measurable birefringence, although the limit on this parameter also depends on the specimen thickness. For illustration, if the lower limit on $|\sin \delta|$ is 0.03, for light of wavelength 550 nm, this corresponds to a lower limit on the measurable birefringence of $\Delta n = 5.25 \times 10^{-6}$ for a sample of thickness 500 microns; or a lower limit on the measurable birefringence of $\Delta n = 7.5 \times 10^{-7}$ for a sample of thickness 3500 microns. Thus it is possible that a thin sample of a material with a given $\Delta n$ will have a $|\sin \delta|$ value that is below the resolution limit that is currently possible, but a thicker sample would be measurable.

Birefringence values may be determined in 3 orthogonal directions which effectively enable a volume measurement. This may be particularly important in some applications such as spherical optics etc. The limits defined below are calculated based on measurements and assuming a 3 mm path length.

Thus the method of this invention provides for the fabrication of diamond material such that birefringence measurements in 3 orthogonal directions each show values of Δn such that:

Δn<2×10$^{-6}$ over areas greater 1 mm×1 mm, but more preferably over areas greater than 2 mm×2 mm, or more preferably over areas greater than 4 mm×4 mm, or even more preferably over areas greater than 7 mm×7 mm or most preferably over areas greater than 15 mm×15 mm.

Δn<5×10$^{-6}$ over areas greater 1 mm×1 mm, but more preferably over areas greater than 2 mm×2 mm, or more preferably over areas greater than 4 mm×4 mm, or even more preferably over areas greater than 7 mm×7 mm or most preferably over areas greater than 15 mm×15 mm.

Δn <1×10$^{-6}$ over areas greater 1 mm×1 mm, but more preferably over areas greater than 2 mm×2 mm, or more preferably over areas greater than 4 mm×4 mm, or even more preferably over areas greater than 7 mm×7 mm or most preferably over areas greater than 15 mm×15 mm.

Where birefringence values lie below a given threshold for each of three orthogonal directions of a particular volume of diamond, then for the purposes of this specification that volume is deemed to have a birefringence value below that threshold.

The method of the invention provides for fabrication of diamond such that for a sample with first, second and third dimensions in three orthogonal directions wherein the first dimension is greater than 1 mm, preferably greater than 2 mm and most preferably greater than 4 mm, and the second and third dimensions are greater than the first dimension and preferably greater than 1 mm, preferably greater than 2 mm, preferably greater than 4 mm, preferably greater than 7 mm and most preferably greater than 15 mm, the maximum birefringence $\Delta n_{[maximum]}$ measured in the three orthogonal directions is less than 1×10$^{-5}$, preferably less than 5×10$^{-6}$, preferably less than 2×10$^{-6}$, and most preferably less than 1×10$^{-6}$, for at least one of the three orthogonal directions, more preferably at least two of the three orthogonal directions and most preferably all three of the three orthogonal directions.

Thus the method of this invention provides for the fabrication of diamond material such that birefringence measurements in 3 orthogonal directions each shows values of $\Delta n_{[maximum]}$ such that:

$\Delta n_{[maximum]}$<5×10$^{-6}$ over areas greater 1 mm×1 mm, but more preferably over areas greater than 2 mm×2 mm, or more preferably over areas greater than 4 mm×4 mm, or even more preferably over areas greater than 7 mm×7 mm or most preferably over areas greater than 15 mm×15 mm.

$\Delta n_{[maximum]}$<2×10$^{-6}$ over areas greater 1 mm×1 mm, but more preferably over areas greater than 2 mm×2 mm, or more preferably over areas greater than 4 mm×4 mm, or even more preferably over areas greater than 7 mm×7 mm or most preferably over areas greater than 15 mm×15 mm.

$\Delta n_{[maximum]}$<1×10$^{-6}$ over areas greater 1 mm×1 mm, but more preferably over areas greater than 2 mm×2 mm, or more preferably over areas greater than 4 mm×4 mm, or even more preferably over areas greater than 7 mm×7 mm or most preferably over areas greater than 15 mm×15 mm.

X-Ray Rocking Curve Measurements

X-ray rocking curve measurement is a method of determining the long range crystallographic quality of a single crystal material. The method of X-ray rocking curve measurement is well known in the art and is described in the book "High Resolution X-ray Diffractometry and Topography" by D. Keith Bowen and Brian K. Tanner.

A perfect single crystal, that is a crystal containing no impurity atoms, vacancies, interstitial atoms or extended defects (such as dislocations or stacking faults), would have a measured rocking curve width that is determined by the theoretical width (the 'Darwin Width'), the amount of elastic curvature imposed by the mounting method and the characteristics of the X-ray beam used to make the measurement (for example, the beam divergence, Δθ, and the precision with which the X-ray energy is selected, Δλ/λ, etc.), often known as 'instrumental broadening' or 'apparatus function'. The Darwin Width can be determined from simulation using fundamental physics and the fundamental properties of the crystal (see for example 'Elements of Modern X-ray Physics', J. Als-Nielsen and Des McMorrow, Wiley, 2001, pages 173-195). The 'instrumental broadening' or 'apparatus function' may be determined by experimentation. Careful mounting of samples is required in order to avoid imposing elastic strain (this is more of a problem with wafer-shaped crystals than with 'blocky' crystals).

For a perfect diamond crystal, the theoretical rocking curve Full Width at Half Maximum (FWHM) for the {400} plane at typical X-ray wavelengths used for diffraction studies is ~1 arc second.

For a real single crystal (that is a crystal that is not perfect), the rocking curve is broadened by the presence of crystallographic defects.

It is possible to deconvolve the instrumental broadening from the total rocking curve so that the true rocking curve width can be known. In this application all values of rocking curve widths are quoted after deconvolution of any instrumental broadening effects.

Rocking curve widths may be measured using X-rays from a synchrotron source with a beam energy resolution Δλ/λ of ~10$^{-8}$ (corresponding to an angular broadening of ~0.0023 arc seconds) and a beam divergence Δθ of ~0.2 arc seconds. Typically, diffraction from the {400} plane of the sample is selected. The relatively large area of the X-ray beam and detector in comparison with the typical crystal dimensions often results in the whole volume of the crystal contributing to the rocking curve measurement.

For rocking curve measurements, the crystal to be measured is typically aligned in the beam path so that the (004) planes (i.e. the set of planes parallel to the major surface of the crystal) satisfy the Bragg condition for diffraction (loosely termed "reflection"). The X-ray detector is positioned where the diffracted bean is of maximum intensity.

The angle between the incoming beam and the diffracting plane is the Bragg angle $\theta_B$ for the particular plane and wavelength being used. $\theta_B$ is given by the Bragg equation:

$$n\lambda = 2d_{(hkl)} \sin \theta_B$$

where n is an integer (frequently 1), λ is the wavelength of the incident x-ray radiation and $d_{(hkl)}$ is interplanar spacing of the relevant plane (hkl), in this case (004). The angle between the diffracting plane and the diffracted beam is also equal to $\theta_B$.

The rocking curve measurement is typically made by tilting the sample by up to about 30 arc seconds from the peak of diffracted intensity about an axis that is perpendicular to both the incident X-ray beam and the normal to the diffracting plane, then passing through the diffraction condition in small angular increments (typically about 0.01 arc seconds). The number of diffracted X-rays detected is counted during fixed dwell times at each orientation (these are typically about 0.1 to 10 seconds with a synchrotron X-ray source; the time chosen being a compromise between the total time taken for the measurement and the signal-to-noise ratio of the final data). The intensity of the diffracted signal at each angular step is plotted to yield the rocking curve; the intensities will normally form a Gaussian distribution. The rocking curve width that is quoted for a sample is the Full Width at Half Maximum (FWHM) of the peak.

The CVD diamond of this invention has a rocking curve FWHM for the (004) reflection of preferably 10 arc seconds or less, more preferably 7 arc seconds or less, more preferably 5 arc seconds or less, more preferably 3 arc seconds or less, more preferably 2 arc seconds or less, and most preferably less than 1.5 arc seconds or less, measured over an area preferably greater than 1 mm×1 mm, more preferably greater than 2 mm×2 mm, more preferably greater than 4 mm×4 mm, more preferably greater than 7 mm×7 mm, and most preferably greater than 15 mm×15 mm, and a thickness preferably greater than 0.2 mm, preferably greater than 0.5 mm, preferably greater than 1 mm, preferably greater than 2 mm, preferably greater than 3 mm, preferably greater than 4 mm.

The diamond material used as the substrate for the synthesis of the CVD diamond of the invention has a rocking curve FWHM for the (004) reflection of 20 arc seconds or less, preferably 10 arc seconds or less, preferably 7 arc seconds or less, preferably 5 arc seconds or less, preferably 3 arc seconds or less, preferably 2 arc seconds or less, preferably less than 1.5 arc seconds or less, measured over an area preferably greater than 1 mm×1 mm, preferably greater than 2 mm×2 mm, preferably greater than 4 mm 4 mm, preferably greater than 7 mm×7 mm, preferably greater than 15 mm×15 mm.

DETAILED DESCRIPTION OF THE INVENTION

The invention will now be described with reference to the following four non-limiting examples in which:

FIG. 1a is a schematic diagram of growth sectors in synthetic diamond grown from a <100> oriented seed at HPHT. For this geometry that stacking faults and extended defects lie predominantly in the growth sectors outside of the central {100}. For simplicity minor growth sectors such as {113} and {115} are ignored in this example;

FIG. 1b is the same diagram as FIG. 1a but indicating a plate cut through the preferred growth sector with a zone of high crystalline perfection indicated by the greyed area;

FIG. 2 is a UV fluorescence image taking using Diamond-View™ of a horizontal section (growth being out of the plane of the paper) showing a central region of higher purity and lower fluorescence (the darker region). In some instances this can be used to aid in selecting the zone with the highest crystallinity (i.e. the highest crystalline quality). However, it should be emphasised that there are instances when low fluorescence does not correspond to the highest crystalline quality;

FIGS. 3a and 3b are {220} projection topographs obtained using a synchrotron X-ray radiation source of the plate described in Example 1 prior to annealing. The zone of highest crystalline purity (i.e. the zone of highest crystalline quality) is the central rectangle found near the centre of the plate. The dark areas are associated with high densities of dislocations and stacking faults;

FIG. 4 is a set of four {111} projection topographs of the plate described in Example 1 after annealing at 2200° C. with stabilizing pressure. The density of the stacking faults and possibly dislocations has been reduced. The black spots present in all images are associated with dirt/damage on the sample surface;

Figure 4:
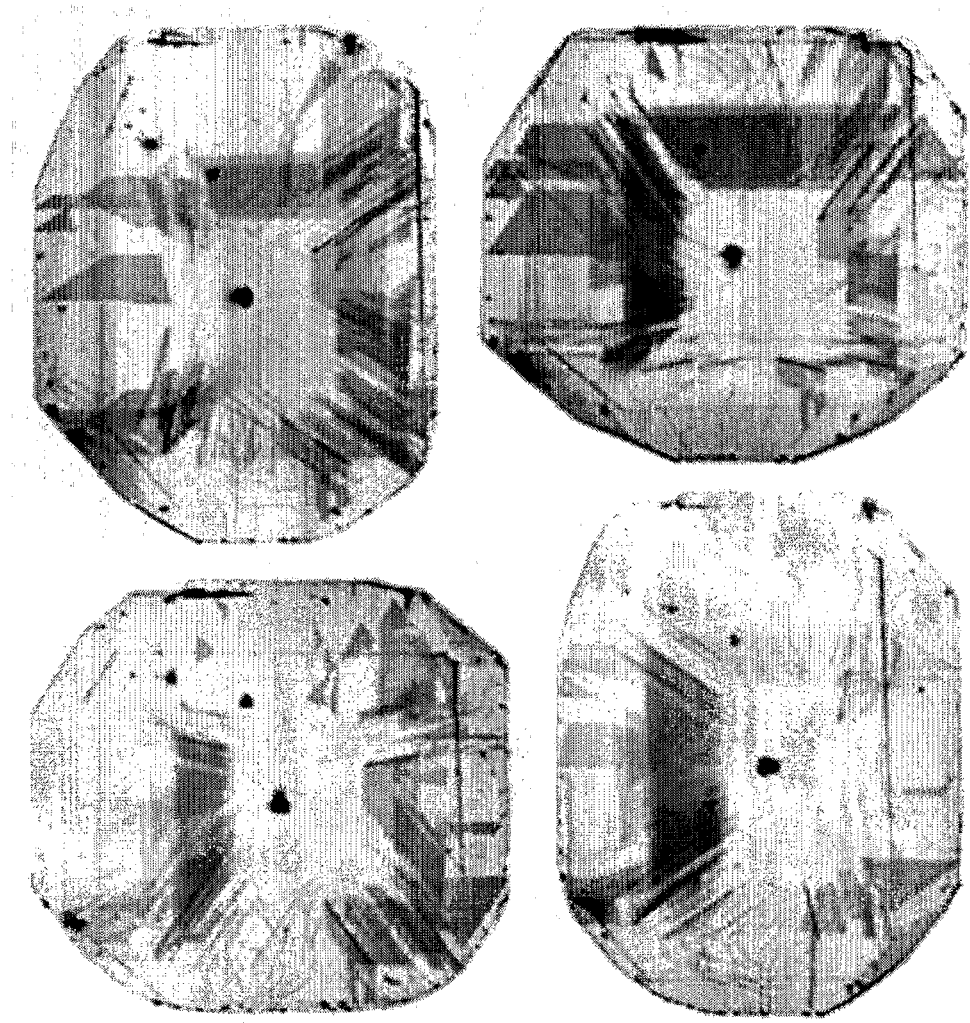
Figure 7:
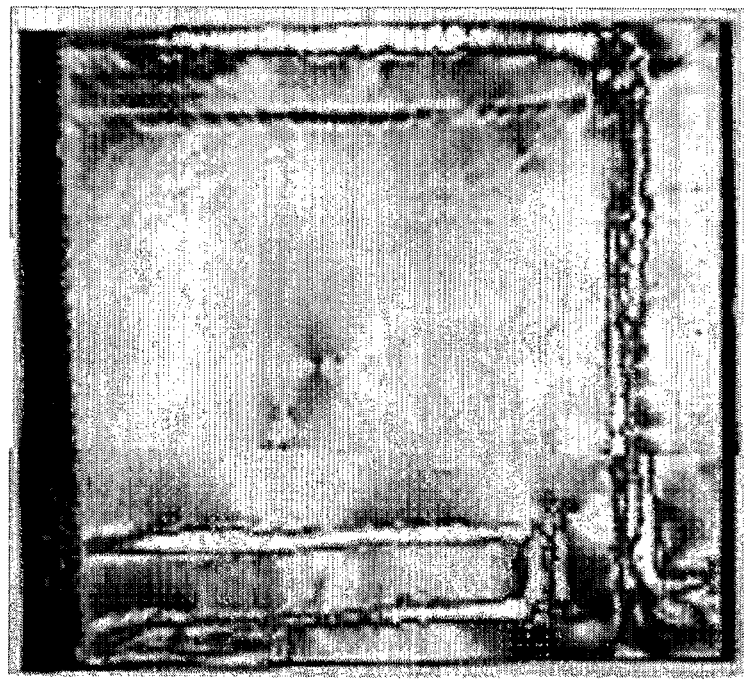
Figure 8:
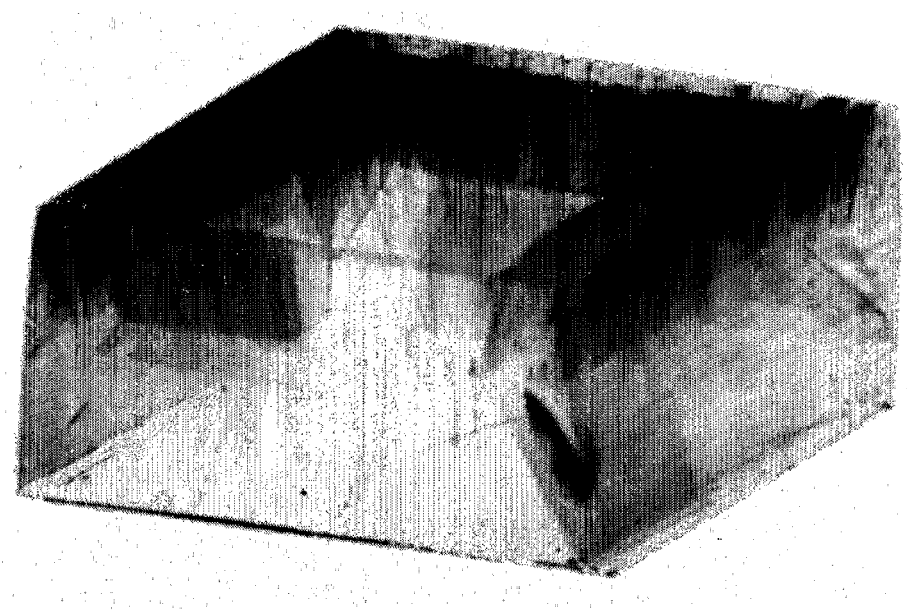
Figure 9:
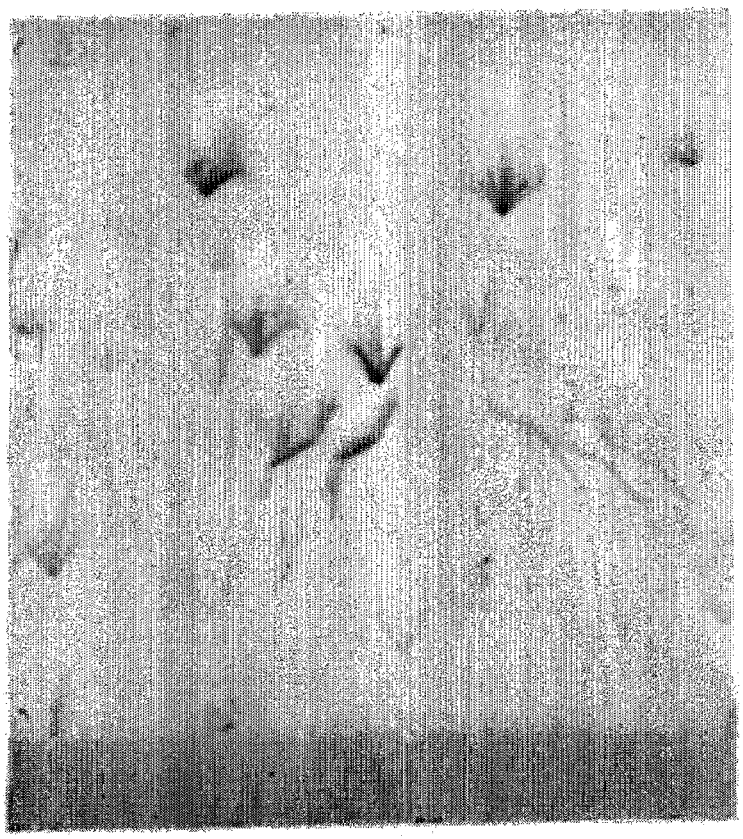
Figure 10:
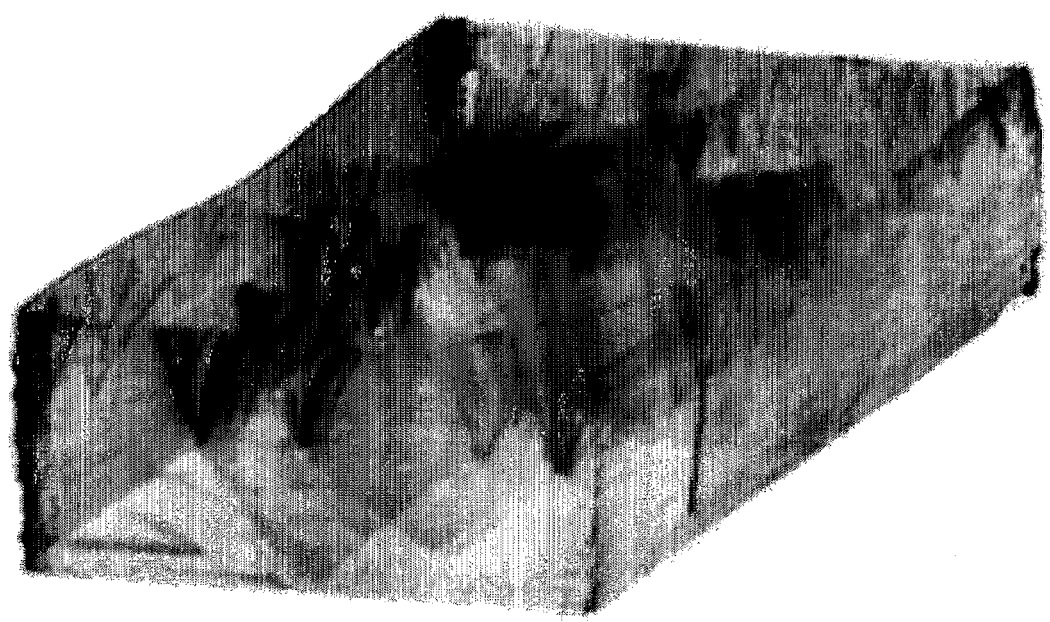
Figure 11:
Figure 12:
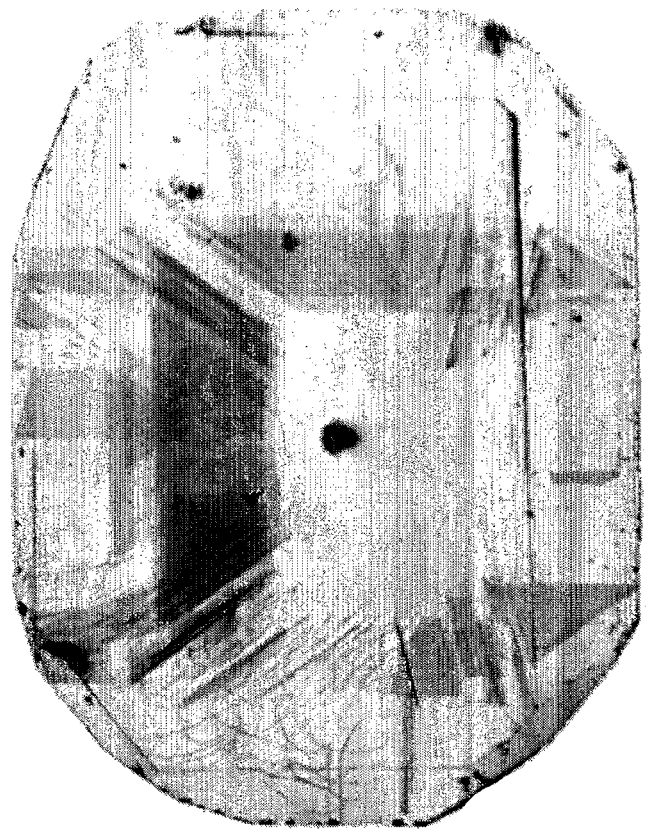
Figure 13:
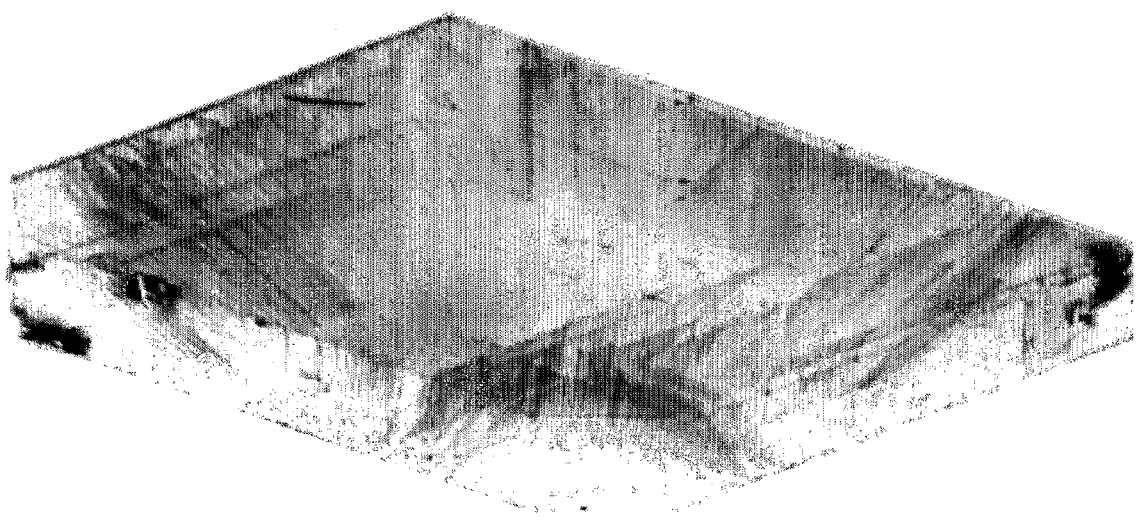
Figure 14:
Figure 15:
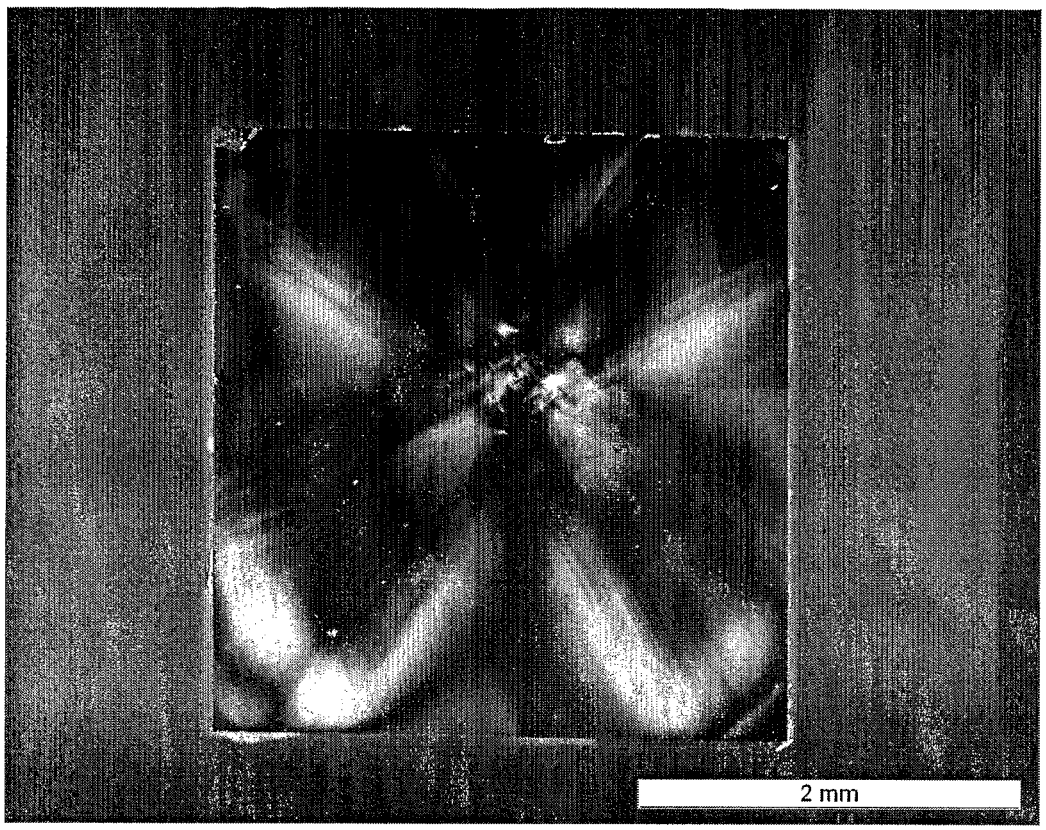
Figure 16A:
Figure 16B:
Figure 17:
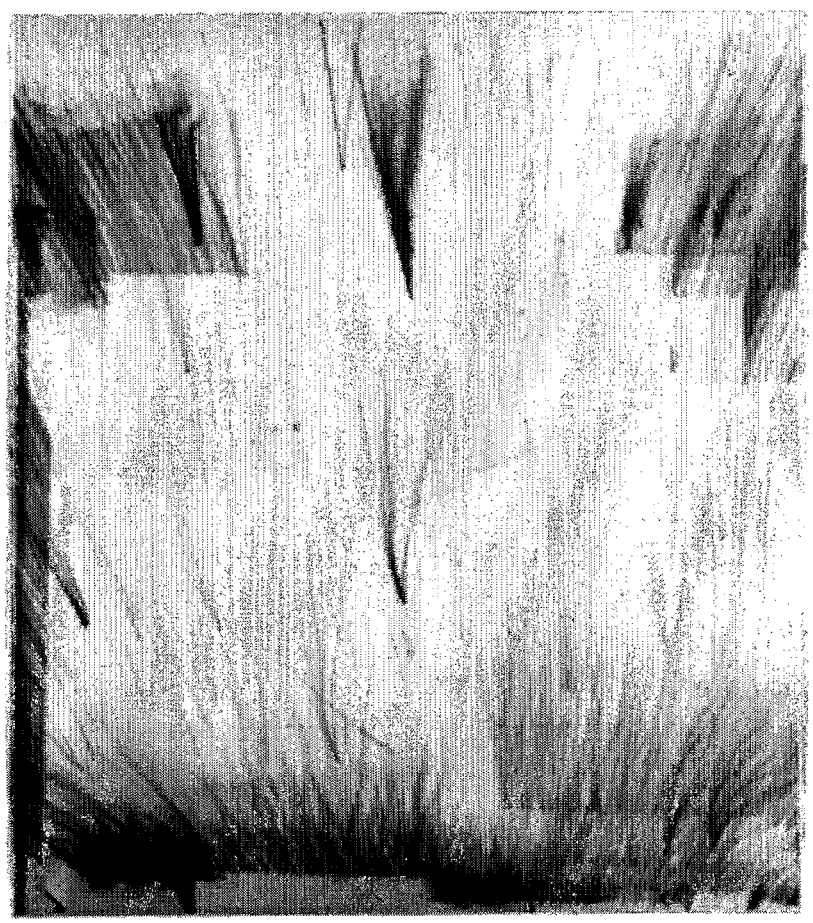
Figure 18:
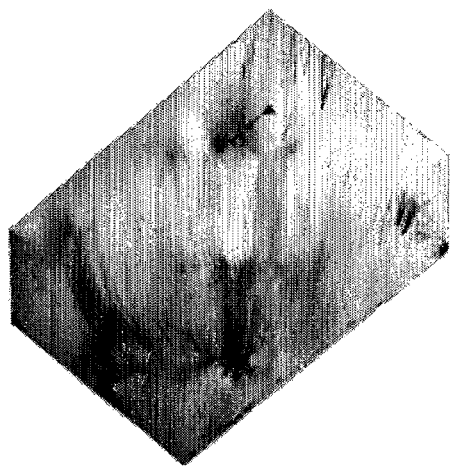

FIG. 7 is a quantitative birefringence image of the CVD layer grown in Example 2 using the Metripol instrument. Notice high stress in outer areas corresponding to original position of the stacking faults in the HPHT IIa plate. The uniform grey area (converted from the false colour image) corresponds to a birefringence of $<1 \times 10^{-5}$;

FIG. 8 is a 3D X-ray topograph showing both the CVD layer and the IIa HPHT substrate characterized in FIG. 4. The dislocation plumes in the CVD starting on the stacking faults in the HPHT IIa substrate. The central area of the CVD plate corresponding to the region showing the lowest birefringence in FIG. 7 is essentially free of stacking faults;

FIG. 9 is a {111} X-ray topograph of Substrate A after high pressure-high temperature annealing and after being overgrown with a boron-doped CVD diamond layer using the conditions in Example 3;

FIG. 10 is a {111} X-ray topograph of Substrate B after being overgrown with a boron-doped CVD diamond layer using the conditions in Example 3. Substrate B was not subjected to a high pressure-high temperature anneal prior to being overgrown with a boron-doped CVD diamond layer;

FIG. 11 is a {111} X-ray projection topography of HPHT IIa Substrate C prior to high pressure-high temperature annealing;

FIG. 12 is a {111} X-ray projection topography of HPHT IIa Substrate C after high pressure-high temperature annealing;

FIG. 13 is an {004} X-ray projection topograph of Substrate D;

FIG. 14 is a birefringence image of Substrate D obtained using a Metripol instrument. The level of birefringence is very low. The image is semi-quantitative in that black indicates the absence of birefringence and progressively more intense colour indicates progressively more birefringence;

FIG. 15 is a birefringence image of Substrate E obtained using a Metripol instrument. Substrate E contained 404 ppm of nitrogen in its central {100} growth sector. It can be seen that there is considerably more birefringence in Substrate E than in Substrate D;

FIG. 16a is a grey scale image of CVD Layer D obtained using a Metripol instrument showing the magnitude of the strain measured in a direction perpendicular to the growth direction. The lighter the shade of grey, the higher the strain, black indicating a low strain and white a high strain;

FIG. 16b is a grey-scale image of CVD Layer D obtained using a Metripol instrument showing the magnitude of the strain measured in a direction parallel to the growth direction. The lighter the shade of grey, the higher the strain, black indicating a low strain and white a high strain;

FIG. 17 is an {004} X-ray projection topograph of CVD Layer D, showing a very low dislocation density in the central {100} growth sector;

FIG. 18 is an {004} X-ray projection topograph of CVD Layer E, showing a much higher dislocation density in the central {100} growth sector than is present in CVD Layer D.

EXAMPLE 1

Based on the method of the invention a HPHT stone was grown with a low nitrogen concentration using the temperature gradient method from an as grown synthetic type Ib HPHT seed. The parent population from which the crystal was drawn was firstly mechanically sorted so as to achieve an improved material. The sorting was done by magnetic selection so as to eliminate crystals with metallic inclusions. Further sorting was done by shape selection using a vibrating table so as to improve the shape factor of the crystals. Further sorting was carried out using a system of screening with a small size interval between the screen sizes, typically so as to achieve a particle with size not more than 550 microns and not less than 500 microns. Finally the smaller quantity of crystals, processed by the steps as outlined above, was examined by a skilled worker so as to select suitable crystals and so as to select the one preferred face of the crystal, having the preferred orientation, such as the (001) orientation. The selection was made on the basis of crystal perfection, quality of the surface and edges and the absence of strain as revealed by, for instance, polarised light microscopy. The chosen seed was therefore preferred because it satisfied selected criteria according to its measured birefringence, shape, morphology and size.

A number of seeds, selected and prepared as described above was used in the HPHT (high pressure-high temperature) synthesis of type IIa diamond crystals as is known in the art, using a solvent catalyst of iron and cobalt and using additives that are known in the art and that have the effect of preventing nitrogen uptake in the diamond crystal.

The HPHT process was carried out at a pressure of 5 GPa and at temperatures from 1260° C. to 1330° C. The time of growth was 200 hours.

After growth the crystals were released from the solidified matrix of solvent/catalyst metals and selected for crystal quality. One such HPHT diamond with a weight of approximately three carats was then confirmed to be type IIa and having a nitrogen concentration less than 2 parts per million (ppm) using Fourier transform infrared spectroscopy (FTIR). The morphology of this stone showed both major and minor facets, but had an external morphology that indicated the prevalence of the preferred growth sector, most typically the (001) or cubic growth sector.

This preferred stone with low nitrogen concentration was processed by mechanical sawing and scaif polishing into three samples with typical thickness 0.5 mm. One of these plates was further examined. The plates were examined using DiamondView™ or an equivalent ultraviolet fluorescence microscope for the existence of well defined growth sectors, including the preferred sector that had been grown from the selected seed face.

Figure 1A:
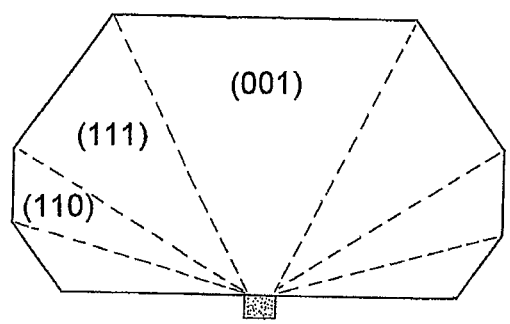
Figure 1B:
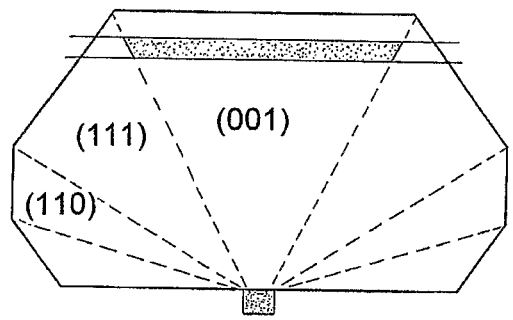
Figure 2:
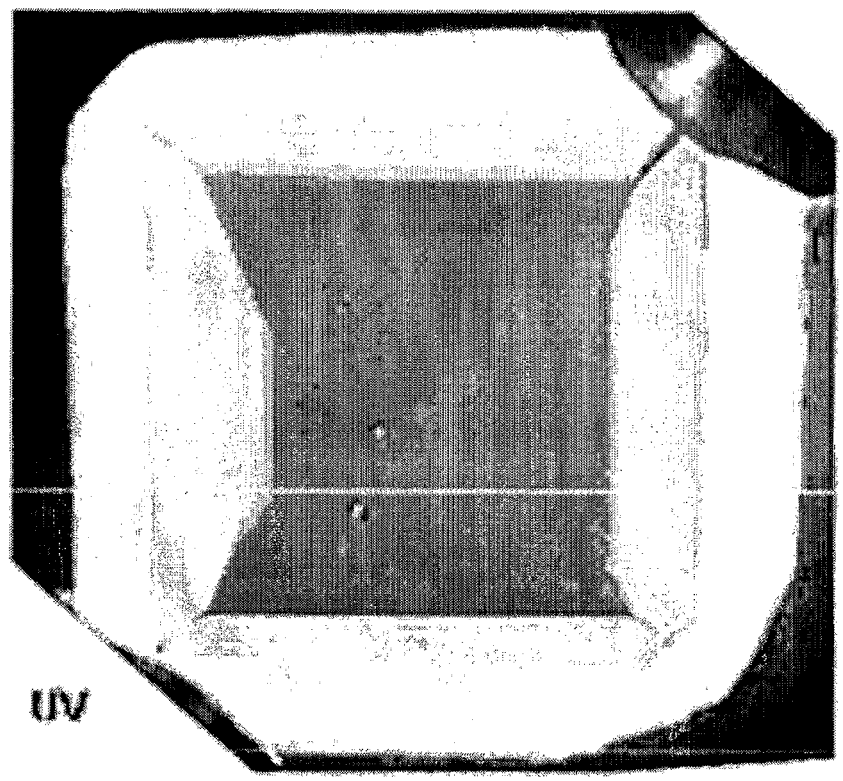
Figure 3A:
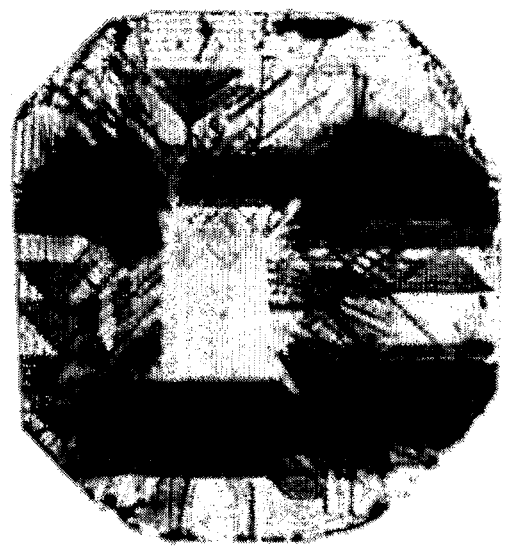
Figure 3B:

The sample was examined prior to annealing using synchrotron X-ray topography (FIG. 3). The {001} plate sample was placed in the beam line with the normal to the plane nominally parallel to the X-ray beam but slightly inclined so that the {220} planes diffract the beam onto the X-ray detector. The two synchrotron topographs in FIG. 3 were formed with (220) and (2-20) refraction planes. The small inclination of the sample in the beam produces a relatively small amount of projection distortion.

Further X-ray topographs were recorded with a laboratory X-ray set after the sample had been HPHT annealed at 2200° C. for 1 hour under diamond stabilising pressure. The four {111} projection topographs in FIG. 4 were recorded using the four different {111} reflections. Three of the topographs were rotated so that approximately the same view of the sample was seen in each case to make it easier to compare the contrast seen from particular regions of the sample, allowing for the fact that there is slightly different projection distortion in each case.

Black dots were visible on the post-anneal images and are caused by surface features that have probably resulted from the HPHT treatment. These regions of strain do not pass into the bulk of the sample and the corresponding material could therefore be polished off. Stacking faults correspond to dark trapezoidal and triangular features incorporating fringes. Contrast does not arise from stacking faults in a given X-ray topograph where the direction of lattice deformation lies in the diffracting plane, but the combined pair of {220} synchrotron X-ray topographs and the combined set of {111} topographs should both show all of the stacking faults present in the sample, making it possible to determine whether the HPHT annealing treatment has changed the stacking faults in any way.

The images showed that stacking fault sizes and positions had been affected by the annealing treatment. Regions were visible within the top 20% and bottom 20%, but excluding the right-hand 25%, in which the stacking faults had been largely removed. The bottom 20% of the sample is also relatively free from stacking faults after the treatment. Prominent stacking faults visible one fifth of the way up the first pre-anneal topograph had been removed by the treatment allowing the clear central area to be extended downwards.

EXAMPLE 2

Based on the method described in the invention a HPHT stone was grown with a low nitrogen concentration using the temperature gradient method from an as grown synthetic type Ib HPHT seed. The parent population from which the crystal was drawn was firstly mechanically sorted so as to achieve an improved material. The sorting was done by magnetic selection so as to eliminate crystals with metallic inclusions. Further sorting was done by shape selection using a vibrating table so as to improve the shape factor of the crystals. Further sorting was carried out using a system of screening with a small size interval between the screen sizes, typically so as to achieve a particle with size not more than 550 microns and not less than 500 microns. Finally the smaller quantity of crystals, processed by the steps as outlined above, was examined by a skilled worker so as to select suitable crystals and so as to select the one preferred face of the crystal, having the preferred orientation, such a the (001) orientation. The selection was made on the basis of crystal perfection, quality of the surface and edges and the absence of strain as revealed by, for instance, polarised light microscopy. The chosen seed was therefore preferred because it satisfied selected criteria according to its measured birefringence, shape, morphology and size.

A number of seeds, selected and prepared as described above was used in the HPHT (high pressure-high temperature) synthesis of type IIa diamond crystals as is known in the art, using a solvent catalyst of iron and cobalt and using additives that are known in the art and that have the effect of preventing nitrogen uptake in the diamond crystal. The HPHT process was carried out at a pressure of 5 GPa and at temperatures from 1260° C. to 1330° C. The time of growth was approximately 200 hours.

After growth the crystals were released from the solidified matrix of solvent/catalyst metals and selected for crystal quality. One such HPHT diamond with a weight of 2.6 carats was then confirmed to be type IIa and having a nitrogen concentration less than 2 parts per million (ppm) using Fourier transform infrared spectroscopy (FTIR). The morphology of this stone showed both major and minor facets, but had an external morphology that indicated the prevalence of the preferred growth sector, most typically the (001) or cubic growth sector.

This preferred stone with low nitrogen concentration was processed by mechanical sawing and scaif polishing into three samples with typical thickness 0.5 mm. One of these plates was further examined. The plates were examined using a DiamondView™ instrument or an equivalent ultraviolet fluorescence microscope for the existence of well defined growth sectors, including the preferred sector that had been grown from the selected seed face.

Figure 5:
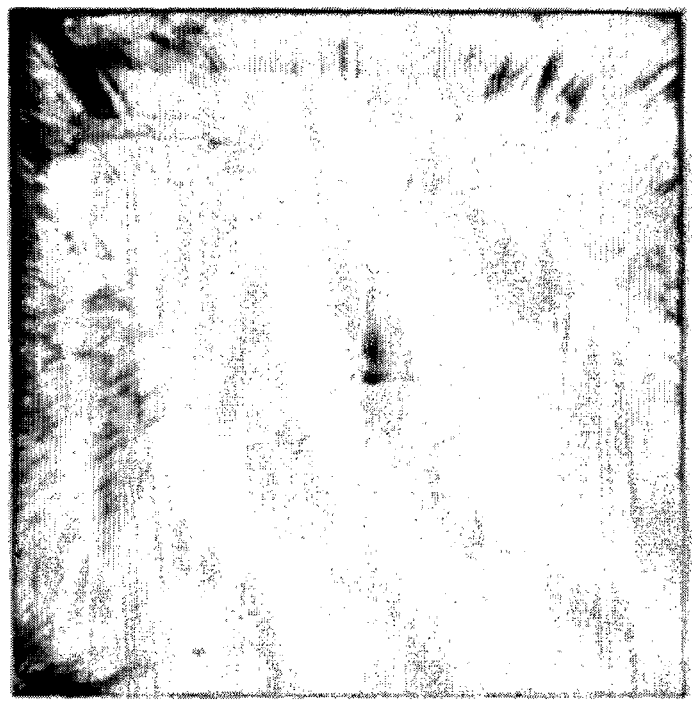
FIG. 5 is a synchrotron X-ray topograph of Ha HPHT plate used in Example 2.

The plate with the largest {100} growth sector was characterized by X-ray topography and the resulting topograph is shown in FIG. 5. The central {100} growth sector of this plate was found to have a very low dislocation density. The outer areas which contain some {111} growth sectors showed a high density of stacking faults.

This material subsequently underwent lapping and polishing, utilising procedures previously optimised to minimise subsurface defects to turn it into plates suitable for use as substrates for a subsequent CVD diamond growth process. The optimisation was performed using a method including a revealing plasma etch to determine the defect levels being introduced by the processing, enabling routine preparation of substrates in which the density of defects measurable after a revealing etch is dependent primarily on the material quality and is generally below $10^2/mm^2$. Substrates prepared by this process are then used for the subsequent synthesis of a homoepitaxial diamond layer by a chemical vapour deposition (CVD) process.

Figure 6:
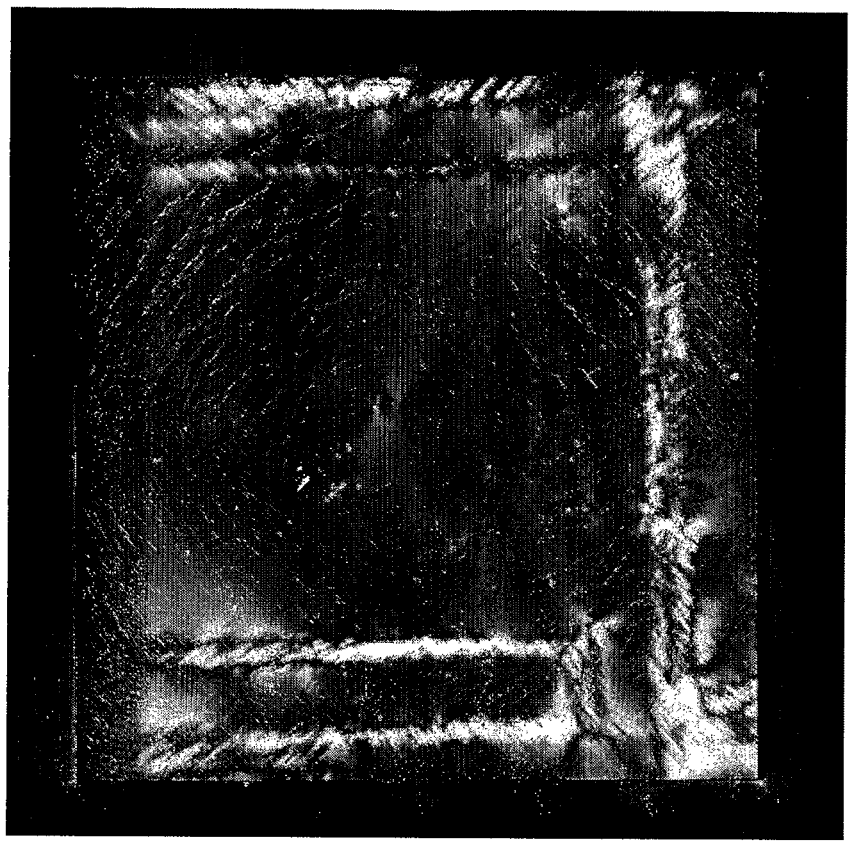
FIG. 6 is birefringence image of the resulting CVD on the HPHT plate for Example 2. Notice high stress (lighter regions) in outer areas corresponding to the high density of stacking faults in these areas in the original HPHT IIa substrate.

The substrate was mounted on a tungsten substrate using a high temperature diamond braze. This was introduced into a CVD synthesis reactor and an etch and growth cycle commenced, and more particularly:
1) The microwave reactor was pre-fitted with point of use purifiers, reducing unintentional contaminant species in the incoming gas stream to below 80 ppb.
2) An in situ oxygen plasma etch was performed using 50/40/3000 sccm (standard cubic centimeter per minute) of $O_2/Ar/H_2$ at $230\times10^2$ Pa and a substrate temperature of 753° C. for a period of 10 minutes.
3) This moved without interruption into a hydrogen etch with the removal of the $O_2$ from the gas flow, at a temperature of 758° C. for a period of 10 minutes.
4) This moved into the growth process by the addition of the carbon source (in this case $CH_4$) and dopant gases. In this instance was $CH_4$ flowing at 160 sccm.
5) On completion of the growth period, the substrate with its homoepitaxial layer was removed from the reactor.
6) This grown layer was characterized by X-ray topographic and birefringence techniques (see FIGS. 6-8).
7) The measured birefringence over a volume greater than 3 mm×3 mm×1 mm was less than $1\times10^{-5}$.
8) The X-ray topograph shown in FIG. 8 confirmed that the crystalline quality, while showing that dislocations were nucleated on stacking faults present in the HPHT IIa substrate. The dislocation density away from these regions, averaged over a 3 mm×3 mm area was less than $100/cm^2$.

EXAMPLE 3

Two HPHT type IIa substrates were prepared according to the description in the summary of invention and Example 1 and 2. Substrate A (with dimensions of 3.42 mm×3.26 mm×0.53 mm) was annealed at 2700 K under stabilizing pressure in order to reduce the {111} stacking fault density. Substrate B (with dimensions of 4.81 mm×3.56 mm×0.67 mm) was not subject to such annealing. Substrates A and B were then used for subsequent CVD deposition in a microwave plasma CVD system under the following reactor conditions: a pressure of 190 Torr, a substrate temperature of between 800° C. and 860° C. measured using an optical pyrometer, 4050 sccm of $H_2$, 54 sccm of Ar, 290 sccm of $CH_4$, and 10 sccm of $B_2H_6$ diluted in $H_2$ at 20 parts per million. Thus onto both substrates a boron-doped CVD diamond layer with an approximate thickness 400 μm was deposited. The CVD diamond layer grown on Substrate A is referred to as "CVD Layer A" and the CVD diamond layer grown on Substrate B is referred to as "CVD Layer B".

Following removal of these samples from the CVD reactor and processing of the sample edges the extended defect content was characterised by X-ray topography, as shown in FIGS. 9 and 10.

It can be seen in FIGS. 9 and 10 that CVD Layer A, grown on the annealed substrate, has a low extended defect density compared with CVD Layer B which was grown on a substrate not subject to annealing. In the case of CVD Layer B, the X-ray topograph shows that threading dislocations have nucleated at the interface between the CVD layer and the HPHT substrate in regions where stacking faults in the HPHT substrate intersect the growth interface. Such features are substantially absent from X-ray topographs of CVD Layer A indicating the strongly beneficial effect of the HPHT annealing of the substrate.

The dislocation densities in the CVD layers were measured from the X-ray topographs and found to be less than $200/cm^2$ for CVD Layer A and approximately $1640/cm^2$ for CVD Layer B.

The boron concentration and uniformity in CVD Layer A was determined by bound to free exciton measurements. Under electron bombardment, some materials emit photons in the infrared-visible-ultraviolet range of energies. This is known as cathodoluminescence (CL). In diamond the presence of boron leads to observation of the bound exciton at 238 nm. Using the ratio of the integrated intensities of the free to bound exciton peaks observed (in the UV) by CL, a calculation of the quantity of uncompensated boron can be determined.

The free exciton (near band gap energy) recombination intensity gives a good indication of the purity of the CVD material. Impurities such as boron can independently affect the overall intensity of the free exciton (FE) and can also produce lower energy bound exciton (BE) recombination features in CL spectra. From extensive Secondary Ion Mass spectroscopy (SIMS) of low nitrogen samples an empirical relationship of the boron (acceptor-recombination) bound exciton to free exciton ratio has been established. The bound/free exciton ratio multiplied by a constant (determined by SIMS experiments) can therefore be used to determine the uncompensated boron content in the CVD diamond layer.

The boron concentration in CVD Layer A was determined using the above method at 42 points separated by 400 μm in directions more-or-less parallel to the edges of the sample, using a 15 kV incident electron beam of nominal diameter 200 nm and a sample temperature of 77 K. The average (i.e. the arithmetical mean) boron concentration over the 42 measurement points was calculated to be 2.90 parts per million (ppm) with a standard deviation of 0.39 ppm. The highest value determined was 3.69 ppm, 27.3% higher than the average value. The lowest value recorded was 2.04 ppm, 29.6% lower than the average value.

The CVD layer grown on the annealed substrate is thus an example in which both the point defect density (in this case intentionally-added boron) and the extended defect density has been controlled.

EXAMPLE 4

As a further example, two substrates (referred to as "Substrate C" and "Substrate D") were selected by X-ray techniques from two large type IIa HPHT grown diamonds. The HPHT type IIa diamonds were grown according to the method described. These diamonds were characterized by various qualitative, semi-quantitative and quantitative birefringence techniques (including the use of a birefringence measurement instrument of the 'Metripol' type). A further substrate, referred to as "Substrate E", was also produced from a large (>3 ct) type Ib HPHT synthetic diamond (i.e. not a specially prepared or selected stone).

Substrates C, D and E, had dimensions 4.4 mm×3.4 mm×0.8 mm, 5.3 mm×5.0 mm×0.7 mm, and 3.0 mm×3.2 mm×0.7 mm respectively.

Substrate C was annealed at a temperature of 2700 K for 15 minutes under stabilizing pressure. FIGS. 11 and 12 are X-ray topographs of Substrate C taken before and after annealing. Although some stacking faults are still present in Substrate C post-anneal, the majority have been annealed out.

Substrates D and E were not annealed.

A {400} X-ray projection topograph of Substrate D is shown in FIG. 13 and the corresponding birefringence image is shown in FIG. 14.

For comparison the birefringence image of the type Ib Substrate E is shown in FIG. 15.

Fourier transform infrared spectroscopy (FTIR) measurements were made on the three substrates to determine their nitrogen content. Substrate E contained approximately 404 ppm of nitrogen in its central growth sector. Substrates C and D were shown to contain less than 1 ppm of nitrogen.

Subsequent to this selection and characterization process, Substrates C, D and E were used as substrates in a microwave plasma CVD process under the following reactor conditions: a pressure of 180 Torr, a substrate temperature of between 800° C. and 860° C., 3000 sccm of $H_2$, 40 sccm of Ar, 165 sccm of $CH_4$, and 21 sccm of $N_2$ diluted in $H_2$ at 100 parts per million.

The as-grown material was separated from its substrate by laser sawing and polished into blocks (referred to henceforth as "CVD Layer C", "CVD Layer D" and "CVD Layer E", where CVD Layer C was grown on Substrate C etc.).

The dimensions of CVD Layer D were 5.5 mm×4.8 mm×3.1 mm.

Birefringence characterization showed that the level of strain in CVD Layer C and CVD Layer D, produced using the HPHT IIa Substrates C and D, was much lower strain than the level of strain in CVD Layer E grown on the type Ib Substrate E.

FIGS. 16a and 16b grey-scale birefringence maps, obtained from a birefringence measurement instrument (such as a 'Metripol' instrument), of the strain level for two perpendicular directions of CVD Layer D (lighter shade corresponds to higher strain levels). Quantitative birefringence measurements on the CVD Layers C, D and E revealed that over a volume greater than 3 mm×3 mm×1 mm (that is greater than 9 mm³), the birefringence of CVD Layer C and CVD Layer D was less than $1\times10^{-5}$, whereas for CVD Layer E it was less than $1\times10^{-4}$ but greater than $1\times10^{-5}$. The measured birefringence of CVD Layer D over a volume of approximately 1 mm×1 mm×1 mm (that is, approximately 1 mm³) was less than $4\times10^{-6}$. The measured birefringence of CVD Layer C over a volume of approximately 1.5 mm×1.5 mm×1 mm (that is, approximately 2.25 mm³) was less than $4\times10^{-6}$.

The birefringence measurements show that CVD Layer C, grown on an annealed Type IIa HPHT substrate, has an extremely low birefringence over a larger volume (more than twice as large) than CVD Layer D, grown on an un-annealed Type IIa HPHT substrate, thereby demonstrating the benefit of the annealing process.

X-ray topographs (FIG. 15 and FIG. 16) confirmed the crystalline quality of CVD Layer C and CVD Layer D, while showing that the dislocations in the CVD layer predominantly nucleated on the stacking faults present in the HPHT IIa material. The dislocation density away from these regions, averaged over a 3 mm×3 mm area was less than 400/cm². In comparison CVD Layer E, grown on Substrate E (the type Ib substrate) showed a much higher dislocation density of greater than 1900/cm².

The FWHM X-ray rocking curve width for CVD Layer D, measured according to the method of invention, was 1.92 arc seconds.

The invention claimed is:

1. A single crystal CVD diamond material, having an extended defect density, as characterized by X-ray topography, of less than 400/cm² over an area of greater than 0.014 cm², having a concentration of nitrogen in a solid part of the material of less than 0.1 ppm, and having an X-ray rocking curve for the (004) reflection with a full width at half maximum (FWHM) of less than 10 arc seconds.

2. A single crystal CVD diamond material, having an extended defect density, as characterized by X-ray topography, of less than 400/cm² over an area of greater than 0.014 cm², having a concentration of nitrogen in a solid part of the material of less than 0.1 ppm, and having an optical isotropy of less than $1\times10^{-5}$ over a volume greater than 0.1 mm³.

3. A single crystal CVD diamond material, having an extended defect density, as characterized by X-ray topography, of less than 400/cm² over an area of greater than 0.014 cm², having a concentration of nitrogen in a solid part of the material of less than 0.1 ppm, and having a total point defect density of less than 10000 ppm.

4. The material of claim 3, wherein the nitrogen concentration is less than 0.01 ppm.

5. The material of claim 3, having a boron concentration of less than 10 ppm.

6. The material of claim 3, having a boron concentration of greater than $1\times10^{18}$ atoms/cm³.

7. The material of claim 3, having a silicon concentration of less than 10 ppm.

8. The material of claim 3, having a sulphur concentration of less than 10 ppm.

9. The material of claim 3, having a sulphur concentration of greater than $1\times10^{18}$ atoms/cm³.

10. The material of claim 3, having a phosphorus concentration of less than 10 ppm.

11. The material of claim 3, having a phosphorus concentration of greater than $1\times10^{18}$ atoms/cm³.

12. The material of claim 3, having a point defect density originating from at least one impurity or dopant other than nitrogen, boron, silicon, sulphur, phosphorus, and hydrogen, of less than 10 ppm.

13. A single crystal CVD diamond material, having an extended defect density, as characterized by X-ray topography, of less than 400/cm² over an area of greater than 0.014 cm², having a concentration of nitrogen in a solid part of the material of less than 0.1 ppm, and having a uniformity of concentration of any point defect comprising nitrogen, boron, silicon, sulphur, or phosphorus, such that, when at least 5 measurements are made at different locations on a surface which is within 5° of being perpendicular to a growth direction, any single value measured is within 75% of an average value of the measurements made.

14. A single crystal CVD diamond material, having a thickness greater than 0.2 mm, an X-ray rocking curve for the (004) reflection with a full width at half maximum (FWHM) of less than 10 arc seconds over an area of greater than 1 mm×1 mm, and having a concentration of nitrogen in a solid part of the material of less than 0.1 ppm.

15. A method for producing the single crystal CVD diamond material of claim 1, comprising:
    growing the single crystal CVD diamond material on a single crystal diamond substrate; and
    controlling a nitrogen concentration of the material to produce single crystal CVD diamond material having a concentration of nitrogen in a solid part of the material of less than 0.1 ppm and an extended defect density, as characterized by X-ray topography, of less than 400/cm$^2$ over an area greater than 0.014 cm$^2$ and having an X-ray rocking curve for the (004) reflection with a full width at half maximum (FWHM) of less than 10 arc seconds,
    wherein the single crystal diamond substrate has at least one property selected from the group consisting of:
    (a) a density of extended defects as characterized by X-ray topography of less than 400/cm$^2$ over an area greater than 0.014 cm$^2$;
    (b) an optical isotropy of less than $1\times10^{-5}$ over a volume greater than 0.1 mm$^3$; and
    (c) a FWHM X-ray rocking curve width for a (004) reflection of less than 20 arc seconds.

16. The method of claim 15, wherein the substrate has less than 1000 cm of stacking fault edge length substantially parallel to a surface of the substrate employed for growth, per cm$^2$ of the surface of the substrate as measured by X-ray topography.

17. The method of claim 15, wherein the substrate has 0 cm of stacking fault edge length substantially parallel to a surface of the substrate employed for growth, per cm$^2$ of the surface of the substrate as measured by X-ray topography.

18. The method of claim 15, wherein the substrate is type Ib diamond.

19. The method of claim 15, wherein the substrate is type IIa diamond.

20. The method of claim 15, wherein the substrate is high temperature-high pressure (HPHT) diamond.

21. The method of claim 15, wherein the substrate is CVD diamond.

22. A method for producing the single crystal CVD diamond material of claim 2, comprising:
    growing the single crystal CVD diamond material on a single crystal diamond substrate; and
    controlling a nitrogen concentration of the material to produce single crystal CVD diamond material having a concentration of nitrogen in a solid part of the material of less than 0.1 ppm and an extended defect density, as characterized by X-ray topography, of less than 400/cm$^2$ over an area greater than 0.014 cm$^2$ and having an optical isotropy of less than $1\times10^{-5}$ over a volume greater than 0.1 mm$^3$,
    wherein the single crystal diamond substrate has at least one property selected from the group consisting of:
    (a) a density of extended defects as characterized by X-ray topography of less than 400/cm$^2$ over an area greater than 0.014 cm$^2$;
    (b) an optical isotropy of less than $1\times10^{-5}$ over a volume greater than 0.1 mm$^3$; and
    (c) a FWHM X-ray rocking curve width for a (004) reflection of less than 20 arc seconds.

23. A method for producing the single crystal CVD diamond material of claim 3, comprising:
    growing the single crystal CVD diamond material on a single crystal diamond substrate; and
    controlling a nitrogen concentration of the material to produce single crystal CVD diamond material having a concentration of nitrogen in a solid part of the material of less than 0.1 ppm and an extended defect density, as characterized by X-ray topography, of less than 400/cm$^2$ over an area greater than 0.014 cm$^2$ and having a total point defect density of less than 10000 ppm,
    wherein the single crystal diamond substrate has at least one property selected from the group consisting of:
    (a) a density of extended defects as characterized by X-ray topography of less than 400/cm$^2$ over an area greater than 0.014 cm$^2$;
    (b) an optical isotropy of less than $1\times10^{-5}$ over a volume greater than 0.1 mm$^3$; and
    (c) a FWHM X-ray rocking curve width for a (004) reflection of less than 20 arc seconds.

24. A method for producing the single crystal CVD diamond material of claim 3, comprising:
    growing the single crystal CVD diamond material on a single crystal diamond substrate; and
    controlling a nitrogen concentration of the material to produce single crystal CVD diamond material having a concentration of nitrogen in a solid part of the material of less than 0.1 ppm and an extended defect density, as characterized by X-ray topography, of less than 400/cm$^2$ over an area greater than 0.014 cm$^2$ and having a uniformity of concentration of any point defect comprising nitrogen, boron, silicon, sulphur, or phosphorus, such that, when at least 5 measurements are made at different locations on a surface which is within 5° of being perpendicular to a growth direction, any single value measured is within 75% of an average value of the measurements made,
    wherein the single crystal diamond substrate has at least one property selected from the group consisting of:
    (a) a density of extended defects as characterized by X-ray topography of less than 400/cm$^2$ over an area greater than 0.014 cm$^2$;
    (b) an optical isotropy of less than $1\times10^{-5}$ over a volume greater than 0.1 mm$^3$; and
    (c) a FWHM X-ray rocking curve width for a (004) reflection of less than 20 arc seconds.

* * * * *